(12) United States Patent
Takakura et al.

(10) Patent No.: US 11,910,526 B2
(45) Date of Patent: Feb. 20, 2024

(54) WIRED CIRCUIT BOARD, CASING, AND BOARD CONTAINING SET

(71) Applicant: NITTO DENKO CORPORATION, Osaka (JP)

(72) Inventors: Hayato Takakura, Osaka (JP); Daigo Tsubai, Osaka (JP); Hiroaki Machitani, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 63 days.

(21) Appl. No.: 17/636,251

(22) PCT Filed: Jun. 11, 2020

(86) PCT No.: PCT/JP2020/023000
§ 371 (c)(1),
(2) Date: Feb. 17, 2022

(87) PCT Pub. No.: WO2021/033398
PCT Pub. Date: Feb. 25, 2021

(65) Prior Publication Data
US 2022/0287177 A1 Sep. 8, 2022

(30) Foreign Application Priority Data
Aug. 21, 2019 (JP) ................. 2019-151381

(51) Int. Cl.
*H05K 1/05* (2006.01)
*H05K 1/09* (2006.01)
*H01B 1/02* (2006.01)

(52) U.S. Cl.
CPC ............ *H05K 1/056* (2013.01); *H01B 1/026* (2013.01); *H05K 1/09* (2013.01); *H05K 2201/0154* (2013.01)

(58) Field of Classification Search
CPC .................................................... H05K 7/0047
See application file for complete search history.

(56) References Cited

U.S. PATENT DOCUMENTS 9,286,924 B1  3/2016 Akatsuka et al.
2004/0245015 A1* 12/2004 Yoshimi ............... H05K 1/0218
174/266

(Continued)

FOREIGN PATENT DOCUMENTS

JP  2004-359270 A  12/2004
JP  2005-303172 A  10/2005

(Continued)

OTHER PUBLICATIONS

JP 2005/303172 A (Translation) (Year: 2023).*

(Continued)

*Primary Examiner* — Hoa C Nguyen
*Assistant Examiner* — John B Freal
(74) *Attorney, Agent, or Firm* — Edwards Neils LLC; Jean C. Edwards, Esq.

(57) ABSTRACT

A wired circuit board includes a metal supporting layer, an insulating base layer and a conductor layer from bottom to top. A peripheral edge of the insulating base layer includes an extension part extending further outward relative to the metal supporting layer. The metal supporting layer has a thickness T1 of 50 μm or more.

11 Claims, 23 Drawing Sheets

(56) References Cited

U.S. PATENT DOCUMENTS

| | | | |
|---|---|---|---|
| 2006/0131065 A1* | 6/2006 | Ohwaki | H01L 24/32 |
| | | | 257/E23.101 |
| 2010/0033875 A1 | 2/2010 | Yoshida et al. | |
| 2010/0157560 A1* | 6/2010 | Kanagawa | G11B 5/486 |
| | | | 361/803 |
| 2012/0007111 A1* | 1/2012 | Lee | H01L 33/642 |
| | | | 257/E33.075 |
| 2013/0343015 A1* | 12/2013 | Malek | G06F 1/183 |
| | | | 361/752 |
| 2017/0282286 A1 | 10/2017 | Kin et al. | |
| 2017/0290099 A1 | 10/2017 | Takebayashi et al. | |
| 2018/0007780 A1 | 1/2018 | Takebayashi et al. | |

FOREIGN PATENT DOCUMENTS

| | | | |
|---|---|---|---|
| JP | 2005303172 A | * | 10/2005 |
| JP | 2007-030917 A | | 2/2007 |
| JP | 2009-184699 A | | 8/2009 |
| JP | 2010-040115 A | | 2/2010 |
| JP | 2011-189974 A | | 9/2011 |
| JP | 2014-022512 A | | 2/2014 |
| JP | 2016-034845 A | | 3/2016 |
| TW | 201811130 A | | 3/2018 |

OTHER PUBLICATIONS

International Search Report Issued in PCT/JP2020/023000 dated Aug. 18, 2020.
Written Opinion Issued in PCT/JP2020/023000 dated Aug. 18, 2020.
International Preliminary Report on Patentability issued by WIPO dated Feb. 17, 2022, in connection with International Patent Application No. PCT/JP2020/023000.
Office Action, issued by the Taiwanese Intellectual Property Office dated Nov. 3, 2023, in connection with Taiwanese Patent Application No. 109120640.

* cited by examiner

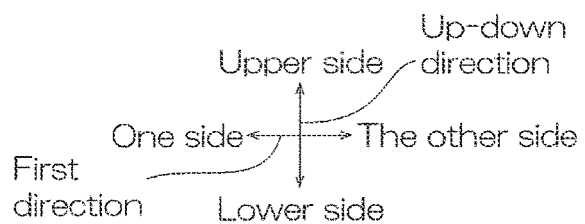
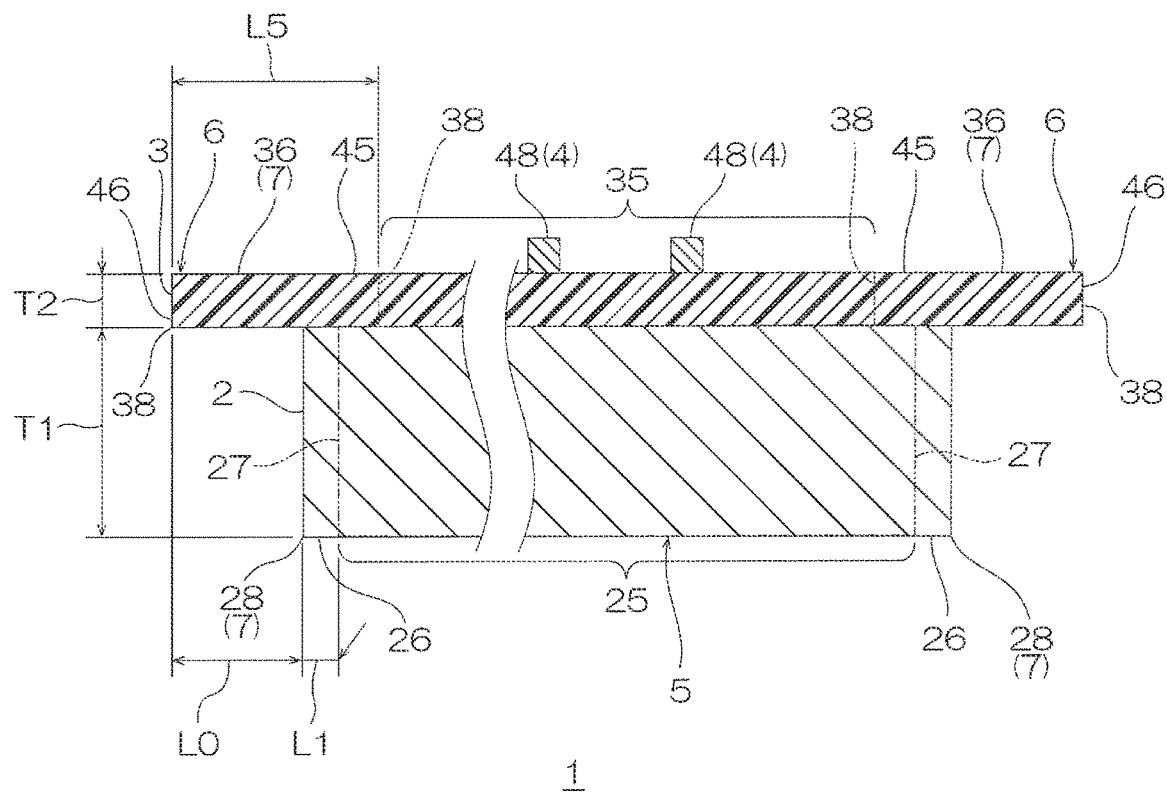
FIG. 2A
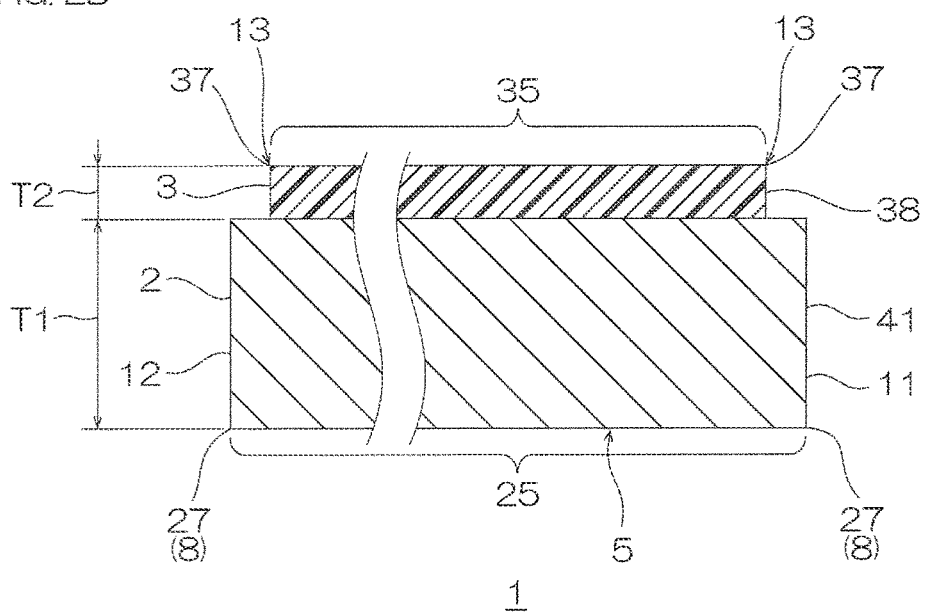
FIG. 2B

FIG. 6
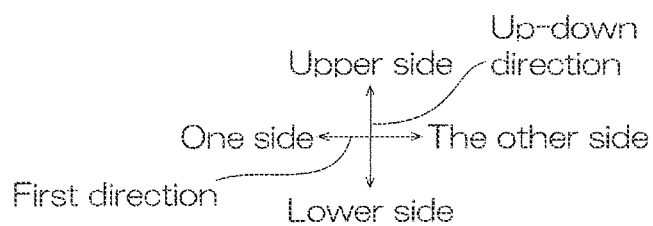
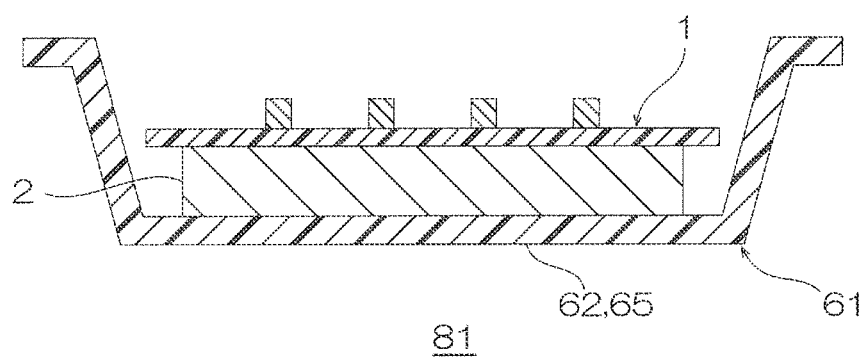
FIG. 7
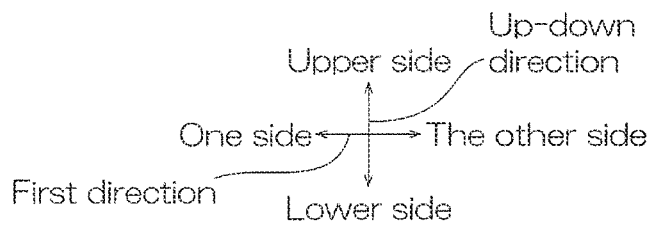
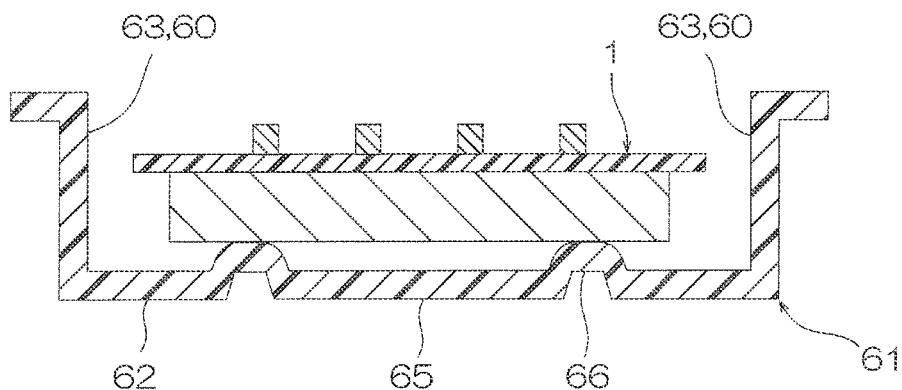

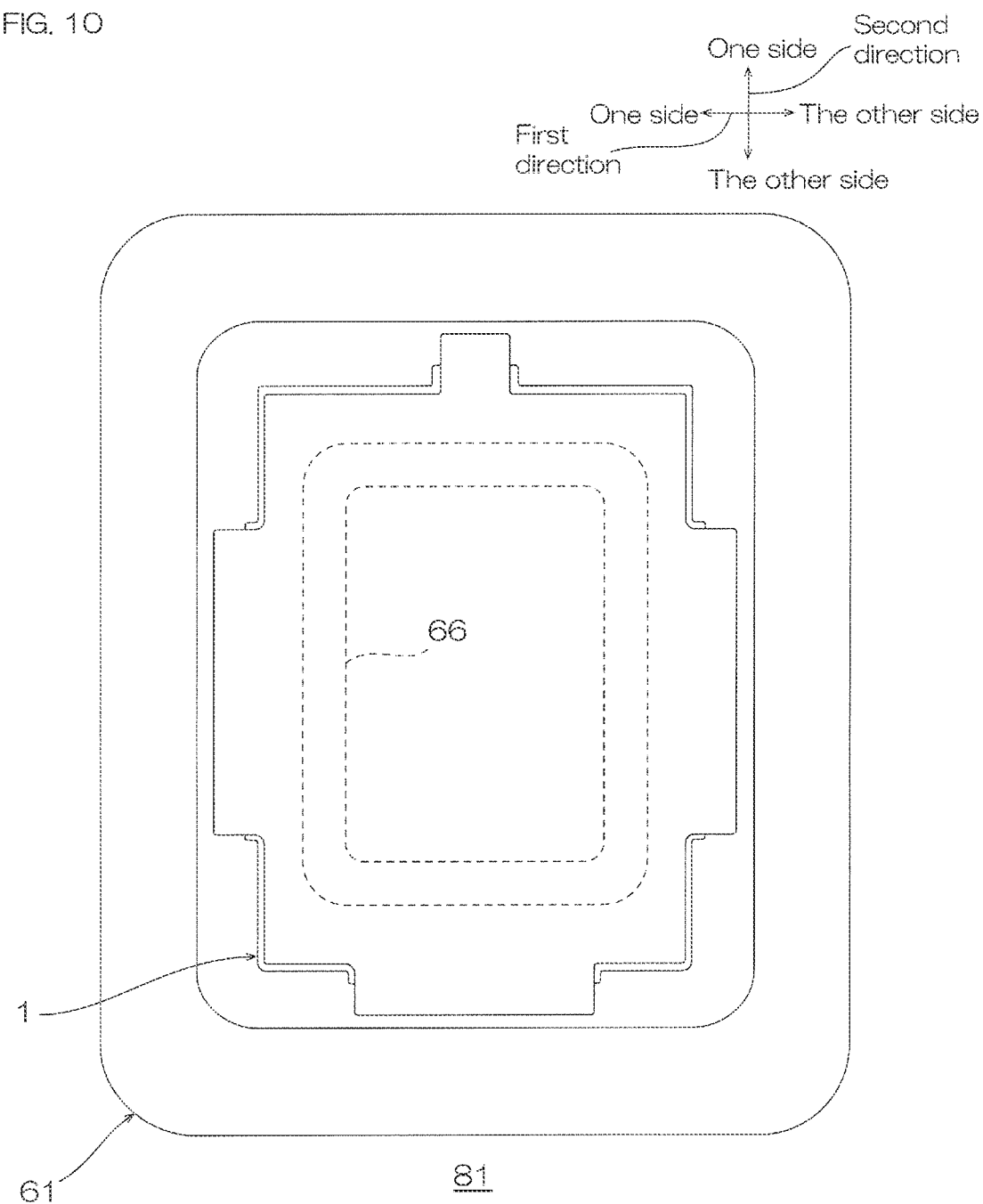

FIG. 11A
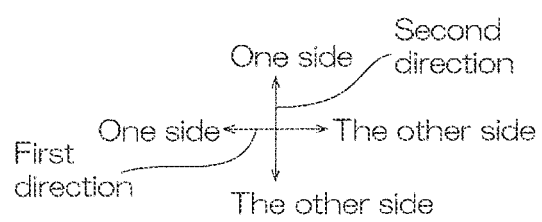
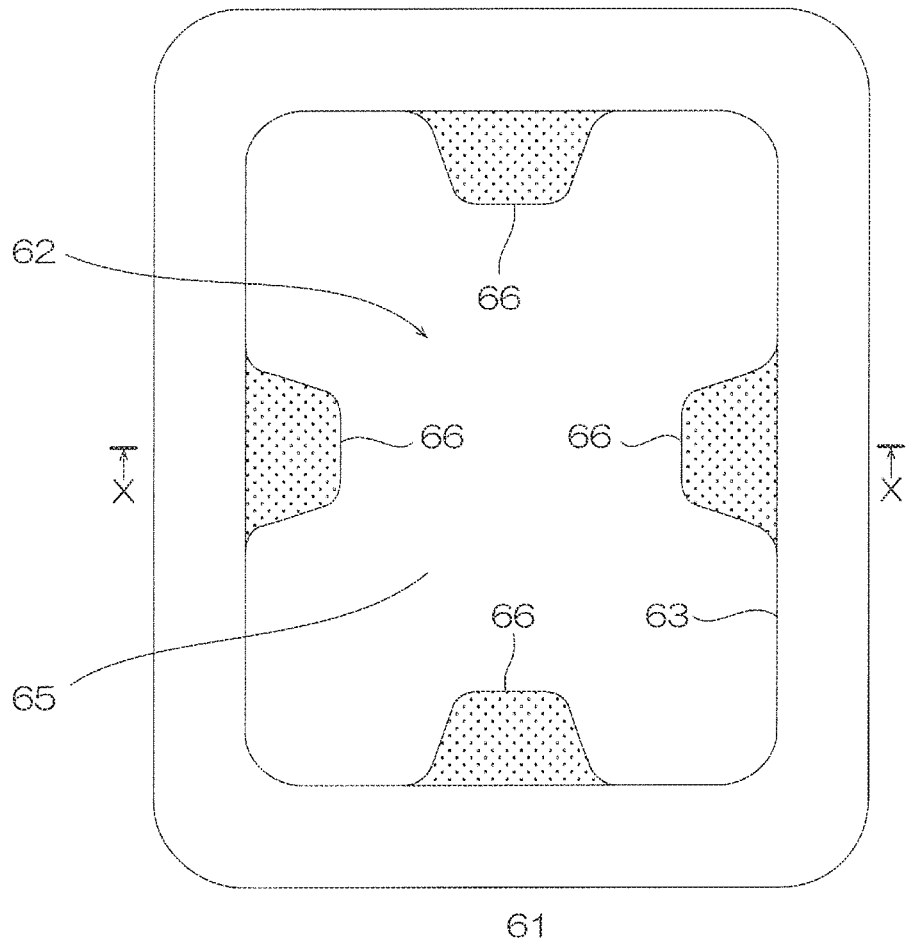
FIG. 11B
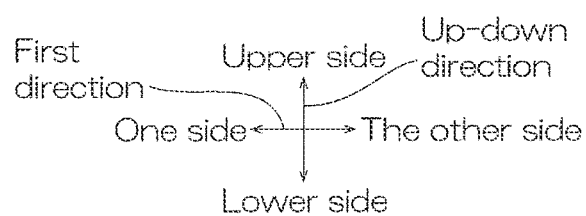
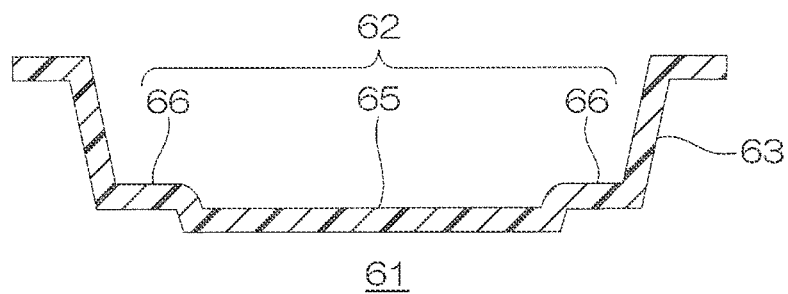

WIRED CIRCUIT BOARD, CASING, AND BOARD CONTAINING SET

CROSS-REFERENCE TO RELATED APPLICATIONS

The present application is a 35 U.S.C. 371 National Stage Entry PCT/JP2020/023000, filed on Jun. 11, 2020, which claims priority from Japanese Patent Application No. 2019-151381, filed on Aug. 21, 2019, the contents of all of which are herein incorporated by reference in their entirety.

TECHNICAL FIELD

The present invention relates to a wired circuit board, a casing, and a board containing set. In particular, the present invention relates to a wired circuit board and a casing, and a board containing set including the wired circuit board and casing.

BACKGROUND ART

Conventional wired circuit boards, which include a metal supporting board, an insulating base layer, and a conductor pattern from bottom to top, have been known (for example, see Patent document 1 below).

In the wired circuit board of Patent document 1, the peripheral edge of the insulating base layer is disposed inside relative to the peripheral edge of the metal supporting board. The wired circuit board of Patent document 1 includes the metal supporting board having a thickness of 10 µm or more and 25 µm or less.

CITATION LIST

Patent Document

Patent Document 1: Japanese Unexamined Patent Publication No. 2010-040115

SUMMARY OF THE INVENTION

Problem to be Solved by the Invention

However, the wired circuit board may be contained in a tubular-shaped casing with a bottom to convey. The casing has a bottom wall, and a peripheral side wall extending upward from the peripheral edge of the bottom wall. When the wired circuit board is contained in the above-described casing, the bottom surface of the metal supporting board is in contact with the bottom wall of the casing. Meanwhile, the peripheral edge of the metal supporting board faces the peripheral side wall, holding a small interval therebetween.

When the casing containing the wired circuit board is transported, the vibrations of the casing during the transportation may cause the wired circuit board to slightly move relative to the casing in the surface direction (a direction along the bottom surface).

In such a transportation of the wired circuit board of Patent document 1, the peripheral edge of the metal supporting board is brought into contact (even worse, collides) with the peripheral side wall of the casing.

The wired circuit board of Patent document 1 includes a thin and flexible metal supporting board with a thickness of 25 µm or less. Thus, the above-described contact is less likely to damage the peripheral side wall of the casing.

On the other hand, depending on the use or purpose, a thick metal supporting board is required. When the thickness of the metal supporting board is set 50 µm or more to meet the requirement, the metal supporting board becomes rigid.

In such a case, the above-described contact is more likely to cause the peripheral edge of the metal supporting board to damage the peripheral side wall of the casing. This causes a chip (foreign matter) from the damaged casing. When the foreign matter contacts the conductor pattern, the contact adversely affects the electrical characteristics of the conductor pattern, and eventually reduces the reliability of the wired circuit board.

The present invention provides a wired circuit board, a casing, and a board containing set that can suppress creation of a foreign matter by the damage to the casing while increasing the thickness of the metal supporting layer.

Means for Solving the Problem

The present invention [1] includes a wired circuit board comprising: a metal supporting layer; an insulating base layer; and a conductor layer from bottom to top, wherein a peripheral edge of the insulating base layer includes an extension part extending further outward relative to the metal supporting layer, and the metal supporting layer has a thickness of 50 µm or more.

The wired circuit board includes the metal supporting layer having a thickness of 50 µm or more. Thus, a thickened metal supporting layer can be provided. Accordingly, the wired circuit board can be used for the purpose that requires the rigidity of the metal supporting layer.

On the other hand, during the transportation of the wired circuit board contained in the casing, when the vibrations by the transportation is transmitted to the wired circuit board and the extension part is brought into contact with the peripheral side wall of the casing, the contact of the peripheral edge of the metal supporting layer located inside relative to the extension part with the peripheral side wall can be suppressed. Thus, the damage to the casing caused by the contact of the peripheral edge of the metal supporting layer can be suppressed. As a result, the reduction in the reliability of the wired circuit board can be suppressed.

Accordingly, the wired circuit board has excellent reliability while being used for the purpose that requires the rigidity of the metal supporting layer.

The present invention [2] includes the wired circuit board in [1], wherein a ratio of the thickness of the metal supporting layer to a thickness of the insulating base layer is 5 or more and 40 or less.

In the wired circuit board, the ratio of the thickness of the metal supporting layer to the thickness of the insulating base layer is 5 or more, namely, large. Thus, the metal supporting layer can be much more rigid than the insulating base layer.

Meanwhile, the ratio of the thickness of the metal supporting layer to the thickness of the insulating base layer is 40 or less. Thus, the insulating base layer can have a certain thickness with respect to the thick metal supporting layer.

The present invention [3] includes the wired circuit board described in [1] or [2] above, wherein the extension part has an extension length of 5 µm or more and 100 µm or less.

The wired circuit board includes the extension part having an extension length of 5 µm or more. Thus, when the extension part is brought into contact with the peripheral side wall, the contact of the peripheral edge of the metal supporting layer with the peripheral side wall can surely be suppressed.

The wired circuit board includes the extension part having an extension length of 100 μm or less. Thus, when the extension part is brought into contact with the peripheral side wall, the breakage of the extension part is suppressed, and the contact of the peripheral edge of the metal supporting layer with the peripheral side wall can surely be suppressed.

The present invention [4] includes the wired circuit board described in described in any one of the above-described [1] to [3], wherein the extension part has a thickness of 1 μm or more and 50 μm or less.

The wired circuit board includes the extension part having a thickness of 1 μm or more. Thus, when the extension part is brought into contact with the peripheral side wall, the contact of the peripheral edge of the metal supporting layer with the peripheral side wall can surely be suppressed.

The wired circuit board includes the extension part having a thickness of 50 μm or less. Thus, the wired circuit board can be thinned.

The present invention [5] includes the wired circuit board described in any one of the above-described [1] to [4], further comprising a peripheral edge having a first side and a second side facing the first side, wherein the first side and the second side include the extension part.

Even when the wired circuit board moves in a facing direction in which the first side and the second side face each other, the extension part included in the first side and the second side can suppress the contact of the peripheral edge of the metal supporting layer located inside relative to the extension part with the peripheral side wall.

The present invention [6] includes the wired circuit board described in any one of the above-described [1] to [5], further comprising a peripheral edge having a first corner portion, and a second corner portion facing the first corner portion, wherein the first corner portion and the second corner portion include the extension part.

Even when the wired circuit board moves in a facing direction in which the first corner portion and the second corner portion face each other, the extension part included in the first corner portion and the second corner portion can suppress the contact of the peripheral edge of the metal supporting layer located inside relative to the extension part with the peripheral side wall.

The present invention [7] includes the wired circuit board described in any one of the above-described [1] to [6], wherein a material of the metal supporting layer is copper or a copper alloy.

The present invention [8] includes the wired circuit board described in any one of the above-described [1] to [7], wherein a material of the extension part is a polyimide resin.

The present invention [9] includes a casing for containing the wired circuit board described in any one of the above-described [1] to [8], the casing comprising: a bottom wall; and a peripheral side wall extending upward from a peripheral edge of the bottom wall, wherein the peripheral side wall has a first part that can be brought into contact with the extension part when the wired circuit board is placed on the bottom wall.

When the wired circuit board is mounted on the bottom wall of the casing, the first part of the peripheral side wall can contact the extension part. Thus, the contact of the first part with the peripheral edge of the metal supporting layer located inside relative to the extension part can be suppressed.

As a result, the casing can contain the wired circuit board while suppressing the reduction in the reliability of the wired circuit board.

The present invention [10] includes the casing described in [9], wherein a peripheral edge of the metal supporting layer has a second extension part extending further outward relative to the insulating base layer, and the peripheral side wall has a second part that is separated from the second extension part by an interval when the first part is brought into contact with the extension part.

However, the second extension part is the peripheral edge of the metal supporting layer extending further outward relative to the insulating base layer. Thus, when the wired circuit board is contained in the casing, the second extension part is easily brought into contact with the peripheral side wall. Thus, the contact is more likely to create a foreign matter.

Nevertheless, the casing has the second part separated from the second extension part by an interval. Thus, the damage to the casing at the second extension part can be suppressed. Consequently, the creation of a foreign matter can be suppressed.

The present invention [11] includes the casing described in [9] or [10], wherein the bottom wall includes a contact portion that can be brought into contact with an internal part disposed inside with respect to a peripheral edge of the metal supporting layer, and an interval portion that can be separated from the peripheral edge of the metal supporting layer by an interval.

The casing includes the bottom wall having the contact portion in contact with the internal part of the peripheral edge of the metal supporting layer. Thus, the position of the wired circuit board can be maintained.

On the other hand, the interval portion is separated from the peripheral edge of the metal supporting layer by an interval. Thus, when the peripheral edge of the metal supporting layer moves relative to the bottom wall in the surface direction, the damage to (scratch on) the bottom wall by the contact can be suppressed.

The present invention [12] includes a board containing set comprising: the wired circuit board described in any one of the above-described [1] to [8]; and the casing described in any one of the above-described [9] to [11] and containing the wired circuit board.

The board containing set can contain the wired circuit board used for the purpose that requires the rigidity of the metal supporting layer by using the casing, while maintaining the excellent reliability of the wired circuit board.

Effects of the Invention

The casing and board containing set of the present invention can contain the wired circuit board of the present invention used for the purpose that requires the rigidity of the metal supporting layer, while maintaining the excellent reliability of the wired circuit board.

BRIEF DESCRIPTION OF THE DRAWINGS

FIG. 2A and FIG. 2B illustrate the wired circuit board illustrated in FIG. 1. FIG. 2A is a cross-sectional view taken along line X-X. FIG. 2B is across-sectional view taken along line Y-Y.

FIG. 3A is a plan view thereof. FIG. 3B is a cross-sectional view taken along line X-X of FIG. 3A.

FIG. 4A is a plan view thereof.

FIG. 4B is a cross-sectional view taken along line X-X of FIG. 4A.

FIG. 5A is a plan view thereof. FIG. 5B is a cross-sectional view taken along line X-X of FIG. 5A.

FIG. 6 is a cross-sectional view of a variation of the board containing set illustrated in FIG. 4B (an example where the bottom wall does not have a bottom wall protrusion portion).

FIG. 7 is a cross-sectional view of a variation of the board containing set illustrated in FIG. 4B (an example where the peripheral side wall is perpendicular to the flat portion).

FIG. 10 is a plan view of a variation of the board containing set illustrated in FIG. 4A (an example where the bottom wall protrusion portion has an approximately rectangular frame shape).

FIG. 11A and FIG. 11B illustrate a variation of the casing illustrated in FIG. 3A and FIG. 3B (an example where the bottom wall protrusion portions are disposed at the peripheral edge portion of the bottom wall). FIG. 1A is a plan view thereof. FIG. 11B is a cross-sectional view taken along line X-X of FIG. 11A.

FIG. 12A is a plan view thereof. FIG. 12B is a cross-sectional view taken along line X-X of FIG. 12A.

FIG. 13A is a plan view thereof. FIG. 13B is a cross-sectional view taken along line Z-Z.

FIG. 14A is a plan view thereof. FIG. 14B is a cross-sectional view taken along line Z-Z of FIG. 14A.

DESCRIPTION OF THE EMBODIMENTS

First Embodiment

The first embodiment of the wired circuit board, casing, and board containing set of the present invention is sequentially described with reference to FIG. 1 to FIG. 5B.

To surely and easily grasp the relative disposition of a wired circuit board 1, a bottom wall 62, and a peripheral side wall 63 (all described below), the peripheral side wall 63 is illustrated only by one line in FIG. 3A, FIG. 4A, and FIG. 5A.

Figure 4A:
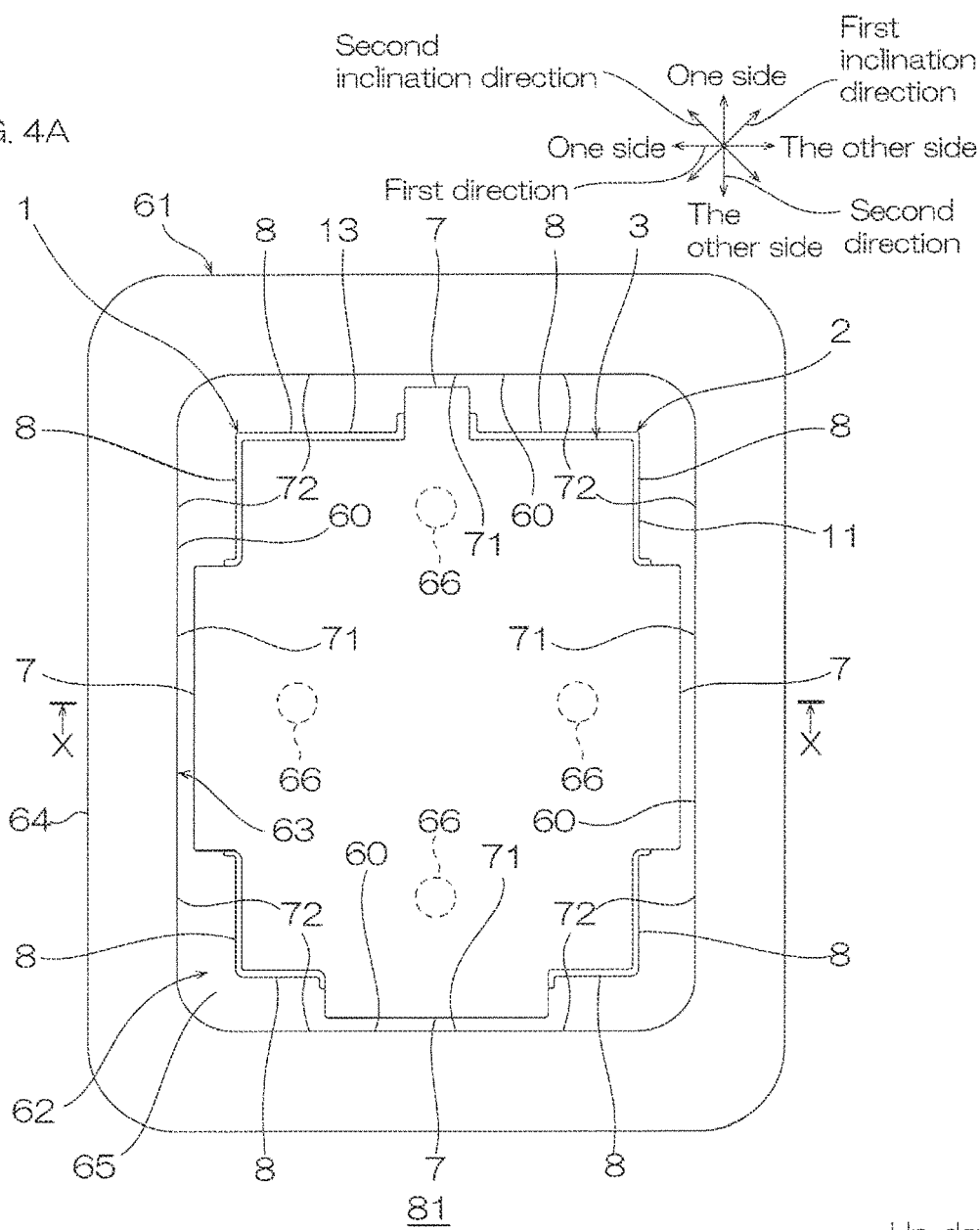
FIG. 4A and FIG. 4B illustrate a board containing set including the wired circuit board illustrated in FIG. 1 and the casing illustrated in FIG. 3A.
Figure 4B:
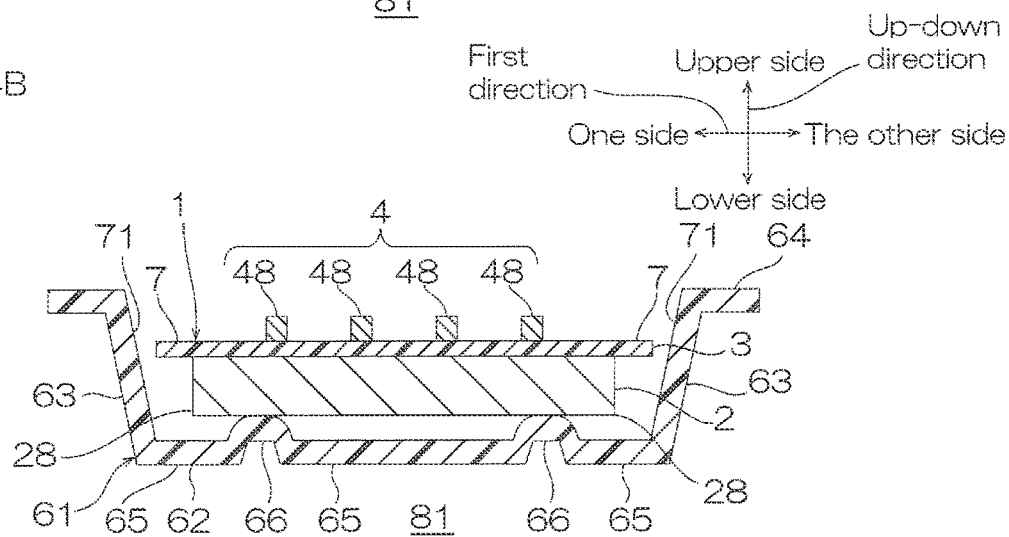
Figure 5A:
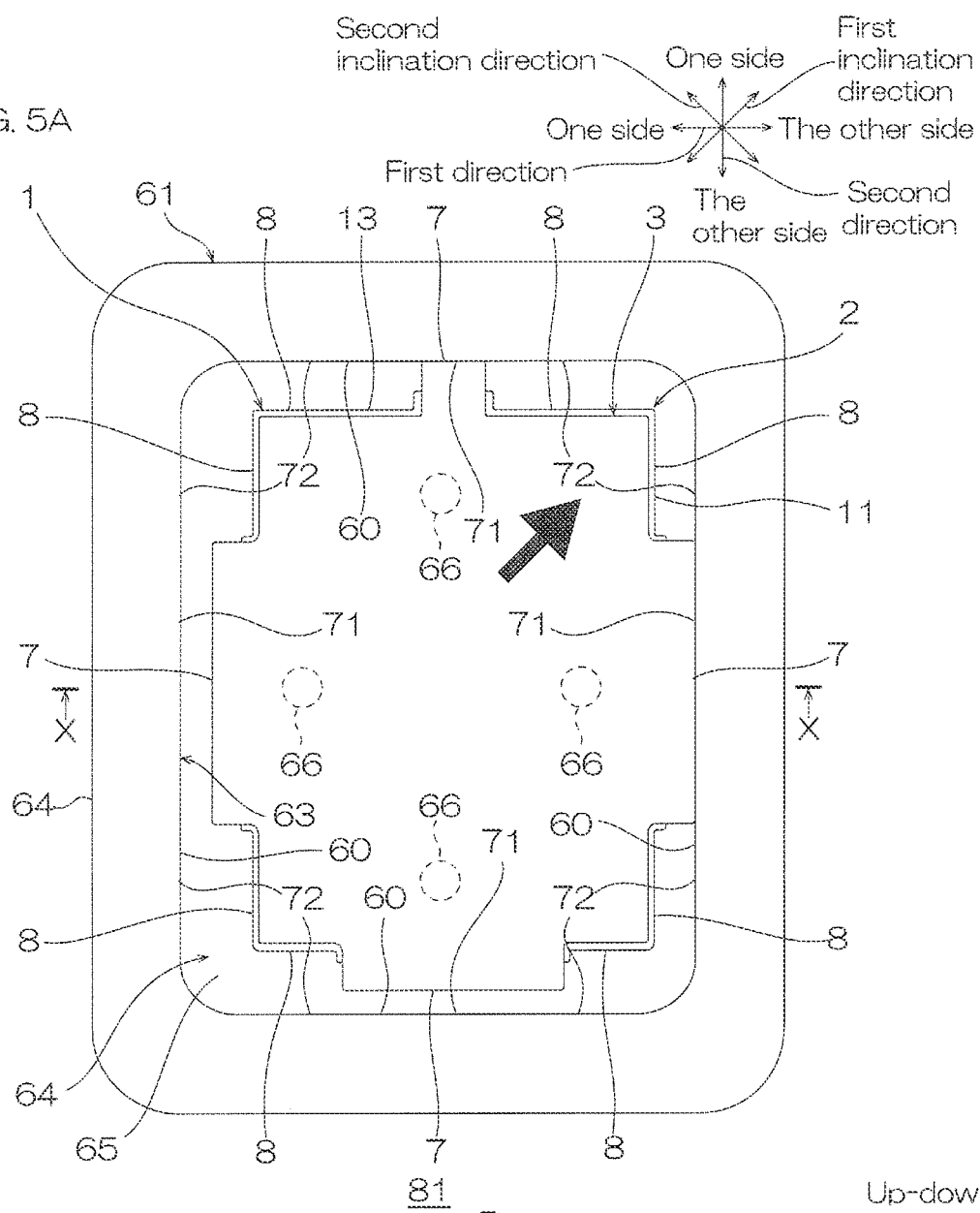
FIG. 5A and FIG. 5B illustrate the board containing set illustrated in FIG. 4A and FIG. 4B when the wired circuit board moves.

To clearly show the relative disposition of the wired circuit board 1, bottom wall 62, and peripheral side wall 63, a conductor layer 4 (see FIG. 1) is omitted in FIG. 4A and FIG. 5A.

[Wired Circuit Board]

Figure 1:
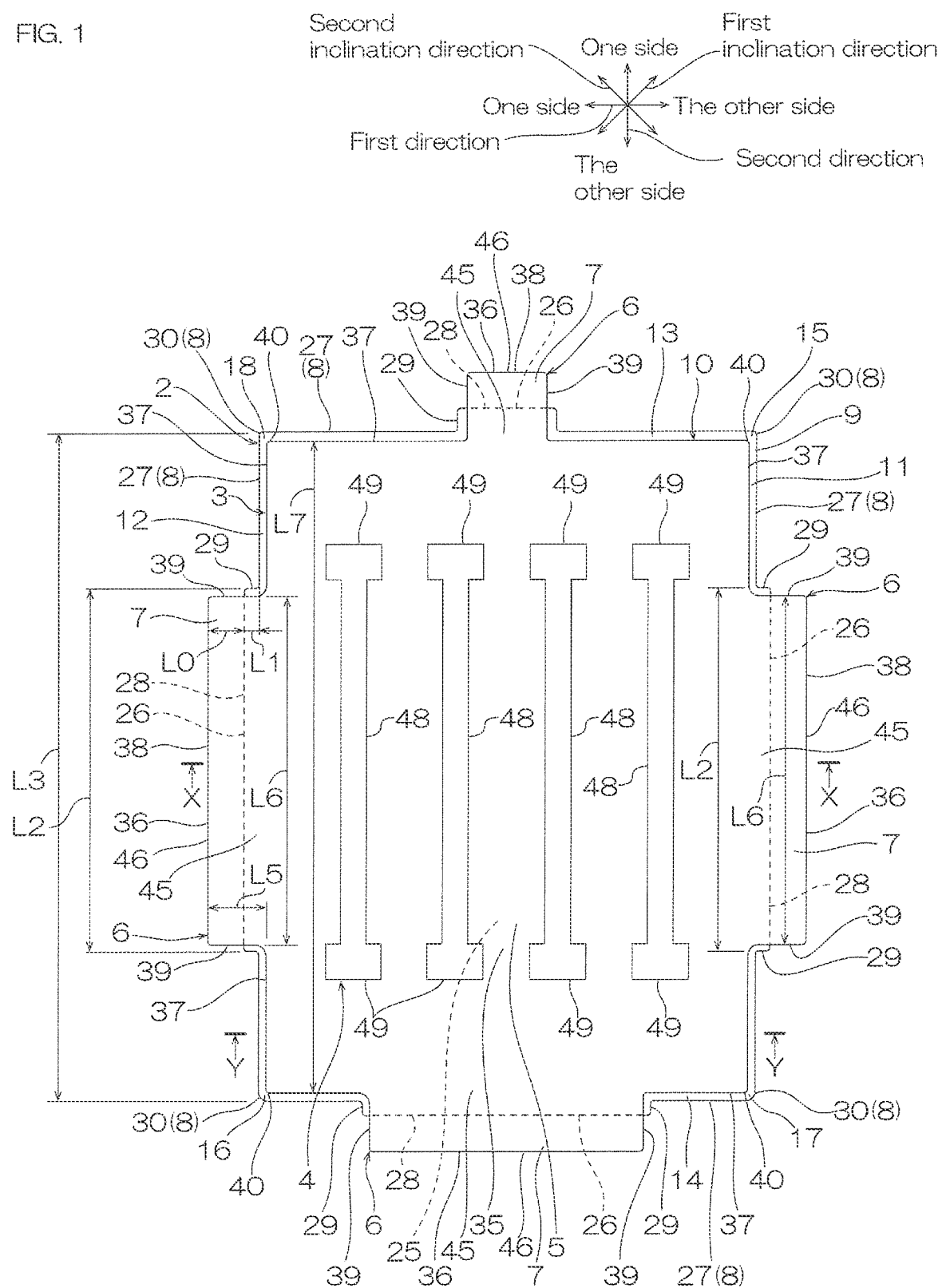
FIG. 1 is a plan view of the first embodiment of the wired circuit board of the present invention.

As illustrated in FIG. 1 to FIG. 2B, the wired circuit board 1 has an approximately board shape thin in an up-down direction and extending in a surface direction orthogonal to the up-down direction. The wired circuit board 1 integrally includes a board body portion 5 having an approximately rectangular shape, and a board protrusion portion 6 protruding outward (outward in the surface direction) from the board body portion 5 in the plan view (namely, when being projected in the up-down direction).

The board body portion 5 has four board side portions as an exemplary peripheral edge of the wired circuit board 1, namely, a board first side portion 11, a board second side portion 12, a board third side portion 13, and a board fourth side portion 14. The board body portion 5 has four board corner portions formed from the ends of the four board side portions, namely, a board first corner portion 15, a board second corner portion 16, a board third corner portion 17, and a board fourth corner portion 18.

The board first side portion 11 and the board second side portion 12 face each other, holding an interval therebetween in a first direction (one direction included in the surface direction) (an exemplary facing direction). The board second side portion 12 is disposed at one side in the first direction, facing the board first side portion 11. Each of the board first side portion 11 and the board second side portion 12 extends along a second direction (included in the surface direction and orthogonal to the first direction).

The board third side portion 13 connects one edge in the second direction of the board first side portion 11 and one edge in the second direction of the board second side portion 12. The board fourth side portion 14 connects the other edge in the second direction of the board first side portion 11 and the other edge in the second direction of the board second side portion 12. The board third side portion 13 and the board fourth side portion 14 face each other in the second direction, holding an interval therebetween. The board third side portion 13 is disposed at one side in the second direction, facing the board fourth side portion 14. Each of the board third side portion 13 and the board fourth side portion 14 extends along the first direction.

The board first corner portion 15 and the board second corner portion 16 face each other. Specifically, the board first corner portion 15 and the board second corner portion 16 face each other in a first inclination direction inclining toward the other side in the second direction while going toward the one side in the first direction. The board first corner portion 15 is formed from one end in the second direction of the board first side portion 11 and the other end in the first direction of the board third side portion 13. The board second corner portion 16 is formed from the other end in the second direction of the board second side portion 12 and the one end in the first direction of the board fourth side portion 14.

The board third corner portion 17 and the board fourth corner portion 18 face each other. Specifically, the board third corner portion 17 and the board fourth corner portion 18 face each other in a second inclination direction (inclination direction intersected by the first inclination direction) inclining toward the one side in the second direction while going toward the one side in the first direction.

The board third corner portion 17 is formed from the other end in the second direction of the board first side portion 11 and the other end in the first direction of the board fourth side portion 14. The board fourth corner portion 18 is formed from the one end in the second direction of the board second side portion 12 and the one end in the first direction of the board third side portion 13.

Each of the four board corner portions of the board body portion 5 forms a right angle.

A plurality of (four) board protrusion portions 6 are provided, corresponding to the plurality of (four) board side portions (the board first side portion 11 to the board fourth side portion 14). The board protrusion portions 6 protrude outward from the board side portions, respectively. Specifically, each of the board protrusion portions 6 has an approximately rectangular shape protruding outward from an intermediate portion of each of the board side portions (the intermediate portions in a direction in which each of the board side portion extends) (preferably, a central portion) in the plan view.

The wired circuit board 1 further includes a metal supporting layer 2, an insulating base layer 3, and the conductor layer 4 from bottom to top. The wired circuit board 1 includes the metal supporting layer 2, the insulating base layer 3 disposed on an upper surface of the metal supporting layer 2, and the conductor layer 4 disposed on an upper surface of the insulating base layer 3.

The metal supporting layer 2 has a board shape extending in the surface direction. The metal supporting layer 2 has a thickness T1 remaining the same in the surface direction. The metal supporting layer 2 integrally includes a metal body portion 25 and a metal protrusion portion 26.

The metal body portion 25 is included in the board body portion 5 in the plan view. The metal body portion 25 is a main body portion (main portion) (supporting main body portion) of the metal supporting layer 2, and has a rectangular shape in the plan view. The metal body portion 25 has metal sides 27 (an exemplary peripheral edge of the metal supporting layer 2) and metal corner portions 30 (an exemplary peripheral edge). Specifically, the metal body portion 25 has four metal sides 27 and four metal corner portions 30.

The four metal sides 27 form (make up) the board first side portion 11, the board second side portion 12, the board third side portion 13, and the board fourth side portion 14, respectively.

The four metal corner portions 30 form (make up) the board first corner portion 15, the board second corner portion 16, the board third corner portion 17, and the board fourth corner portion 18, respectively.

The metal protrusion portion 26 illustrated by dotted lines in FIG. 1 and by a solid line in FIG. 2A is included in the board protrusion portion 6 in the plan view. The metal protrusion portion 26 protrudes outward from the metal body portion 25 of the metal supporting layer 2. The metal protrusion portion 26 is also a supporting member that secondarily supports an extension part 7 (described below) of the insulating base layer 3.

The metal protrusion portion 26 protrudes outward from each of the four metal sides 27 of the metal body portion 25 in the surface direction. Specifically, the metal protrusion portion 26 has an approximately rectangular shape protruding outward from an intermediate portion (in the direction in which each of the metal sides 27 extends) of one of the metal sides 27 of the metal body portion 25 in the plan view. A plurality of (for example, four) metal protrusion portions 26 is provided for one metal body portion 25.

Each of the metal protrusion portions 26 has metal protrusion sides 28 (illustrated by the dotted lines in FIG. 1) and a metal connection side 29 as an exemplary peripheral edge.

The metal protrusion side 28 is separated outward from one metal side 27 of the metal body portion 25 by an interval therebetween. The metal protrusion side 28 is parallel to the corresponding metal side 27.

The metal connection sides 29 connect the intermediate portion of one metal side 27 of the metal body portion 25 and the metal protrusion side 28. Two metal connection sides 29 are provided for one metal protrusion side 28. Specifically, the two metal connection sides 29 connect two points of the intermediate portion of one metal side 27 of the metal body portion 25 and both edges of the metal protrusion side 28, respectively, in a protrusion direction.

The material of the metal supporting layer 2 is appropriately selected from metallic materials (specifically, metal materials) and used. Specific examples of the metallic materials include the metal elements classified as the 1st to 16th groups and alloys containing two or more of the metal elements. The metallic materials may be either of transition metals or basic metals. More specific examples of the metallic materials include the Group 2 metal elements such as calcium, the Group 4 metal elements such as titanium and zirconium, the Group 5 metal elements such as vanadium, the Group 6 metal elements such as chromium, molybdenum, and tungsten, the Group 7 metal elements such as manganese, the Group 8 metal elements such as iron, the Group 9 metal elements such as cobalt, the Group 10 metal elements such as nickel, and platinum, the Group 11 metal elements such as copper, silver, and gold, the Group 12 metal elements such as zinc, the Group 13 metal elements such as aluminum, and gallium, and the Group 14 metal elements such as germanium and tin. These can be used singly or in combination of two or more.

Preferably, the Group 11 metal elements and alloys containing the Group 11 metal elements are used. More preferably, copper and copper alloys are used to secure excellent conductive property.

The lower limit of the thickness T1 of the metal supporting layer 2 is, 50 µm, preferably 75 µm, more preferably 100

μm. The upper limit of the thickness T1 of the metal supporting layer 2 is, for example, 10 mm, preferably 1 mm.

When the thickness T1 of the metal supporting layer 2 does not reach the above-described lower limit, the wired circuit board 1 cannot be used for the purpose that requires the rigidity of the metal supporting layer 2.

On the other hand, when the thickness T1 of the metal supporting layer 2 is the above-described upper limit or less, the reduction in handleability of the wired circuit board 1 caused by an excessive thickness can be suppressed.

The outer size of the metal supporting layer 2 is not especially limited. The lower limit of a protrusion length L1 of the metal protrusion portion 26 is, for example, 1 μm, preferably 3 μm. The upper limit of the protrusion length L1 of the metal protrusion portion 26 is, for example, 50 μm, preferably 30 μm. The protrusion length L1 of the metal protrusion portion 26 is specifically the length of the metal connection side 29.

A second-direction length (width) (the length of the metal protrusion side 28) L2 of the metal protrusion portion 26 protruding from the board first side portion 11 and a second-direction length (width) (the length of the metal protrusion side 28) L2 of the metal protrusion portion 26 protruding from the board second side portion 12 are identical. A first-direction length (width) (the length of the metal protrusion side 28) of the metal protrusion portion 26 protruding from the board third side portion 13 is smaller than a first-direction length (width) (the length of the metal protrusion side 28) of the metal protrusion portion 26 protruding from the board fourth side portion 14.

The lower limit of a ratio (L2/L3) of a width L2 of the metal protrusion portion 26 to a length L3 (between both edges of) the metal side 27 is, for example, 0.1, preferably 0.2. The upper limit of the ratio (L2/L3) of the width of the metal protrusion portion 26 to the length of the metal side 27 is, for example, 0.9, preferably 0.8.

The insulating base layer 3 has a board shape in the surface direction. The insulating base layer 3 has a thickness T2 remaining the same in the surface direction. The insulating base layer 3 integrally includes a base body portion 35 and a base protrusion portion 36.

The base body portion 35 is a main body portion (main portion) (insulating main body portion) that insulates the conductor layer 4 from the metal supporting layer 2 in the insulating base layer 3. The base body portion 35 has a rectangular shape smaller than the metal body portion 25 in the plan view. The base body portion 35 is included in the metal body portion 25 when being projected in the up-down direction. The base body portion 35 has base sides 37 (an exemplary peripheral edge), and base corner portions 40 (an exemplary peripheral edge). Specifically, the base body portion 35 has four base sides 37 and four base corner portions 40.

The four base sides 37 form (make up) the board first side portion 11, the board second side portion 12, the board third side portion 13, and the board fourth side portion 14 together with the four metal sides 27, respectively. The four base sides 37 are located inside relative to the corresponding four metal sides 27, respectively. In this manner, the four metal sides 27 become second extension parts 8 (described below) extending further outward relative to the four base sides 37.

The four base corner portions 40 form (make up) the board first corner portion 15, the board second corner portion 16, the board third corner portion 17, and the board fourth corner portion 18 together with the four metal corner portions 30, respectively. The four base corner portions 40 are located inside relative to the corresponding four metal corner portions 30, respectively. In this manner, the four metal corner portions 30 become second extension parts 8 (described below) extending further outward relative to the four base corner portions 40. The second extension parts 8 of the metal corner portions 30 are included in (overlap) the second extension parts 8 of the metal sides 27.

The base protrusion portion 36 is included in the board protrusion portion 6 in the plan view. The base protrusion portion 36 protrudes outward from the base body portion 35 of the insulating base layer 3. The base protrusion portion 36 protrudes outward from the four base sides 37 of the base body portion 35 in the surface direction. Specifically, the base protrusion portion 36 protrudes outward from an intermediate portion of one base side 37 in the surface direction. A plurality of (for example, the same number as the metal protrusion portions 26, preferably, four) base protrusion portions 36 is provided for one base body portion 35.

Each of the base protrusion portions 36 has a base protrusion side 38 and base connection sides 39 as an exemplary peripheral edge of the insulating base layer 3.

The base protrusion side 38 is separated outward from one base side 37 of the base body portion 35 by an interval therebetween. The base protrusion side 38 is parallel to the corresponding base side 37.

The base connection sides 39 connect an intermediate portion (in a direction in which the base side 37 extends) of one base side 37 of the base body portion 35 and the base protrusion side 38. Two base connection sides 39 are provided for one base protrusion side 38. Specifically, the two base connection sides 39 connect two points of the intermediate portion of one base side 37 of the base body portion 35 and both edges of the base protrusion side 38 in a protrusion direction.

In the base protrusion portion 36, a base free end portion 46 including the base protrusion side 38 extends (protrudes) outward from the metal protrusion side 28 of the metal protrusion portion 26, and forms the extension part 7. The base protrusion side 38 of the extension part 7 is located outside relative to the metal protrusion side 28. A lower surface of the extension part 7 is exposed downward. In other words, the metal supporting layer 2 does not exist (is not disposed) under a lower side of the extension part 7.

On the other hand, the base fixed end portion 45 of the base protrusion portion 36 overlaps (the metal protrusion portion 26 and the internal part of the metal protrusion portion 26 of) the metal supporting layer 2.

On the peripheral edge of the wired circuit board 1, the parts other than the extension parts 7 form the second extension parts 8. The second extension parts 8 are part where the metal side 27 (peripheral edge) of the metal supporting layer 2 extends further outward relative to the base side 37 (peripheral edge) of the insulating base layer 3. The second extension parts 8 are parts where the four metal sides 27 and the four metal corner portions 30 further extend outward relative to the corresponding four base sides 37 and the corresponding four base corner portions 40, respectively.

On the peripheral edge of the wired circuit board 1, the extension parts 7 and the second extension parts 8 are alternately disposed along a peripheral direction.

In the first embodiment, the four extension parts 7 are located at the outermost sides in the board first side portion 11, board second side portion 12, board third side portion 13, and board fourth side portion 14 of the wired circuit board 1, respectively.

Examples of the material of the insulating base layer 3 include insulating resins such as polyimide resin and epoxy resin. Preferably, polyimide resin is used to secure excellent heat resistance.

The lower limit of the thickness T2 of the insulating base layer 3 is, 1 μm, preferably 5 μm. The upper limit of the thickness T2 of the insulating base layer 3 is, for example, 100 μm, preferably 50 μm.

The lower limit of a ratio (T1/T2) of a thickness T1 of the metal supporting layer 2 to a thickness T2 of the insulating base layer 3 is, for example, 5, preferably 10. The upper limit of the ratio (T1/T2) of the thickness of the metal supporting layer 2 to the thickness of the insulating base layer 3 is, for example, 40, preferably 30.

When the ratio (T1/T2) of the thickness T1 of the metal supporting layer 2 to the thickness T2 of the insulating base layer 3 is the above-described lower limit or more, the metal supporting layer 2 can be much more rigid than the insulating base layer 3.

When the ratio (T1/T2) of the thickness T1 of the metal supporting layer 2 to the thickness T2 of the insulating base layer 3 is the above-described upper limit or less, the insulating base layer 3 can have a certain thickness T2 with respect to the thick metal supporting layer 2.

The outer size of the insulating base layer 3 is not especially limited as long as the extension parts 7 can be formed. The lower limit of a protrusion length L5 of the base protrusion portion 36 is, for example, 3 μm, preferably 5 μm, more preferably 10 μm. The upper limit of the protrusion length L5 of the base protrusion portion 36 is, for example, 150 μm, preferably 100 μm, more preferably 70 μm. Specifically, the protrusion length L5 of the base protrusion portion 36 is the length of the base connection side 39.

A second-direction length (width) (the length of the base protrusion side 38) L6 of the base protrusion portion 36 protruding from the board first side portion 11 and a second-direction length (width) (the length of the base protrusion side 38) L6 of the base protrusion portion 36 protruding from the board second side portion 12 are identical. A first-direction length (width) (the length of the base protrusion side 38) of the base protrusion portion 36 protruding from the board third side portion 13 is smaller than a first-direction length (width) (the length of the base protrusion side 38) of the base protrusion portion 36 protruding from the board fourth side portion 14.

The lower limit of a ratio (L6/L7) of a width L6 of the base protrusion portion 36 to a length L7 (the length between both edges of) the base side 37 is, for example, 0.1, preferably 0.2. The upper limit of the ratio (L6/L7) of the width L6 of the base protrusion portion 36 to the length L7 (the length between both edges of) the base side 37 is, for example, 0.9, preferably 0.8.

The lower limit of a ratio (L5/L1) of the protrusion length L5 of the base protrusion portion 36 to the protrusion length L1 of the metal protrusion portion 26 is, for example, 1.5, preferably 2, more preferably 3. The upper limit of the ratio (L5/L1) of the protrusion length L5 of the base protrusion portion 36 to the protrusion length L1 of the metal protrusion portion 26 is, for example, 1000, preferably 100.

The lower limit of a ratio (L6/L2) of a length L6 of the base protrusion portion 36 to a length L2 of the metal protrusion portion 26 is, for example, 0.1, preferably 0.5. The upper limit of the ratio (L6/L2) of the length L6 of the base protrusion portion 36 to the length L2 of the metal protrusion portion 26 is, for example, 10, preferably 2.

When the above-described ratios are within the above-described ranges, the breakage of the extension part 7 can be suppressed. Consequently, the contact of the peripheral edge of the metal supporting layer 2 corresponding to the extension part 7 with the peripheral side wall 63 can be suppressed.

The lower limit of the extension length L0 of the extension part 7 is, for example, 5 μm, preferably 10 μm. The upper limit of the extension length L0 of the extension part 7 is, for example, 100 μm, preferably 75 μm. The extension length L0 of the extension part 7 is an extension length (distance) between the base protrusion side 38 and the metal protrusion side 28.

When the extension length L0 of the extension part 7 is the above-described lower limit or more, the contact of the peripheral edge of the metal supporting layer 2 with the peripheral side wall 63 can further more be suppressed.

When the extension length L0 of the extension part 7 is the above-described upper limit or less, the breakage of the extension part 7 by the contact with the peripheral side wall 63 is suppressed. As a result, the contact of the peripheral edge of the metal supporting layer 2 with the peripheral side wall 63 can surely be suppressed.

The lower limit of a ratio (L0/L5) of the extension length L0 of the extension part 7 to the protrusion length L5 of the base protrusion portion 36 is, for example, 0.1, preferably 0.2. The upper limit of the ratio (L0/L5) of the extension length L0 of the extension part 7 to the protrusion length L5 of the base protrusion portion 36 is, for example, 1, preferably 0.9.

When the ratio of the extension length L0 of the extension part 7 is the above-described lower limit or more and the upper limit or less, the breakage of the extension part 7 can be suppressed when the extension part 7 is brought into contact with the peripheral side wall 63.

The thickness T2 of the extension part 7 is the same as the above-described thickness T2 of the insulating base layer 3.

When the thickness T2 of the extension part 7 is the above-described lower limit or more, the breakage of the extension part 7 can be suppressed when the extension part 7 is brought into contact with the peripheral side wall 63, and the contact of the peripheral edge of the metal supporting layer 2 with the peripheral side wall 63 can further more be suppressed.

When the thickness T2 of the extension part 7 is the above-described upper limit or less, the wired circuit board 1 can be thinned.

The conductor layer 4 is disposed on an upper surface of the base body portion 35. The conductor layer 4 has a wire 48 and a terminal 49. A plurality of the wires 48 is disposed, holding an interval therebetween in the first direction. Each of the wires 48 extends in the second direction. The terminals 49 continue to both ends of the wire 48 in the second direction. Examples of the material of the conductor layer 4 include copper, silver, gold, iron, aluminum, chromium, and alloys thereof. Preferably, copper is used as the material of the conductor layer 4 to obtain excellent electrical characteristics. The lower limit of the thickness of the conductor layer 4 is, for example, 1 μm, preferably 5 μm. The upper limit of the thickness of the conductor layer 4 is, for example, 50 μm, preferably 30 μm.

To produce the wired circuit board 1, for example, a flat board-shaped metal sheet is prepared. Thereafter, the insulating base layer 3 and conductor layer 4 having the above-described shapes are sequentially formed. Then, the outer shape of the metal sheet is processed to form the metal supporting layer 2. In this manner, the extension parts 7 where the peripheral edge of the insulating base layer 3 extends from the metal supporting layer 2. At the same time, the second extension parts 8 where the peripheral edge of the metal supporting layer 2 extends from the insulating base layer 3 is formed.

Figure 3A:
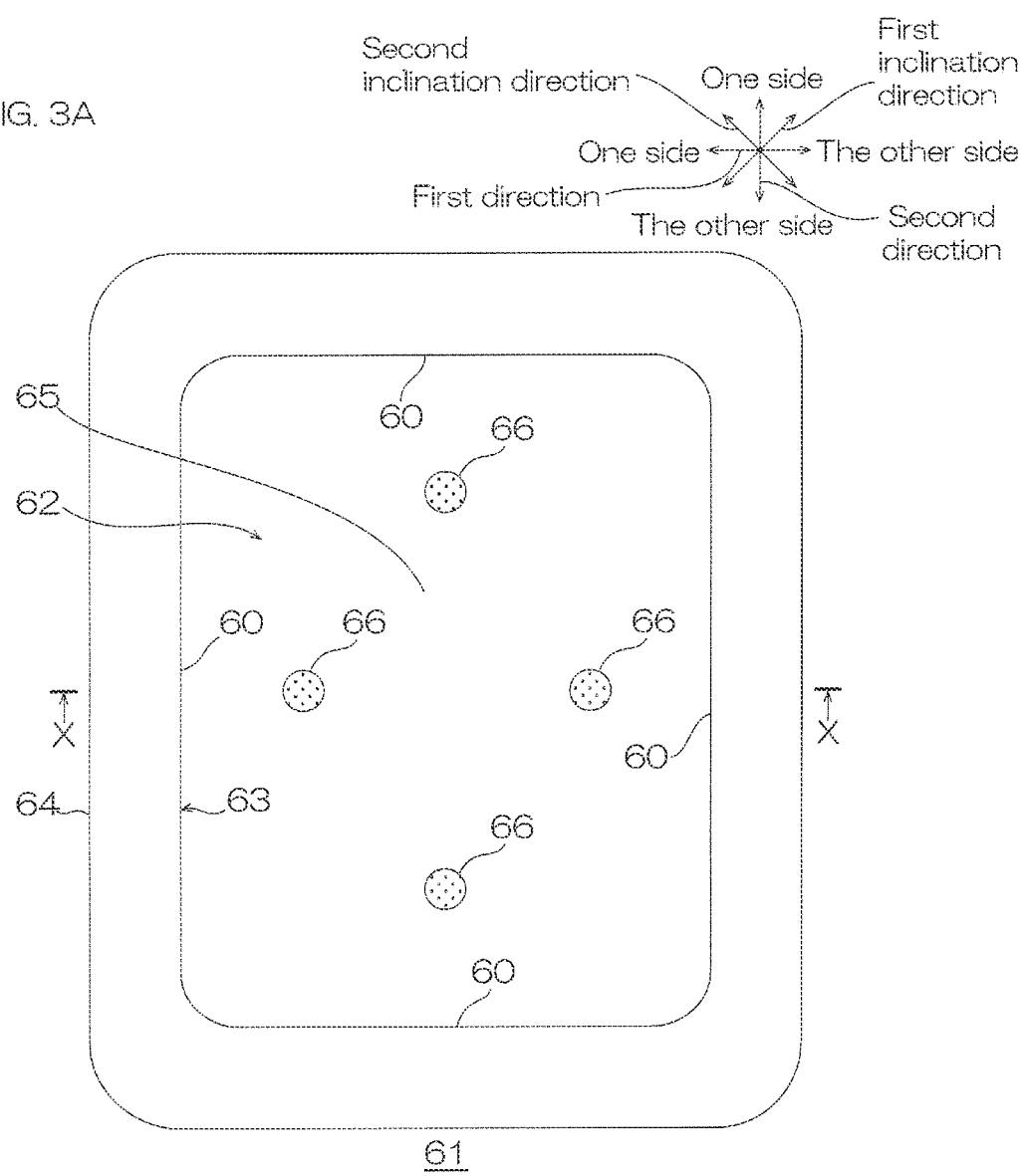
FIG. 3A and FIG. 3B illustrate a casing for containing the wired circuit board illustrated in FIG. 1.
Figure 3B:
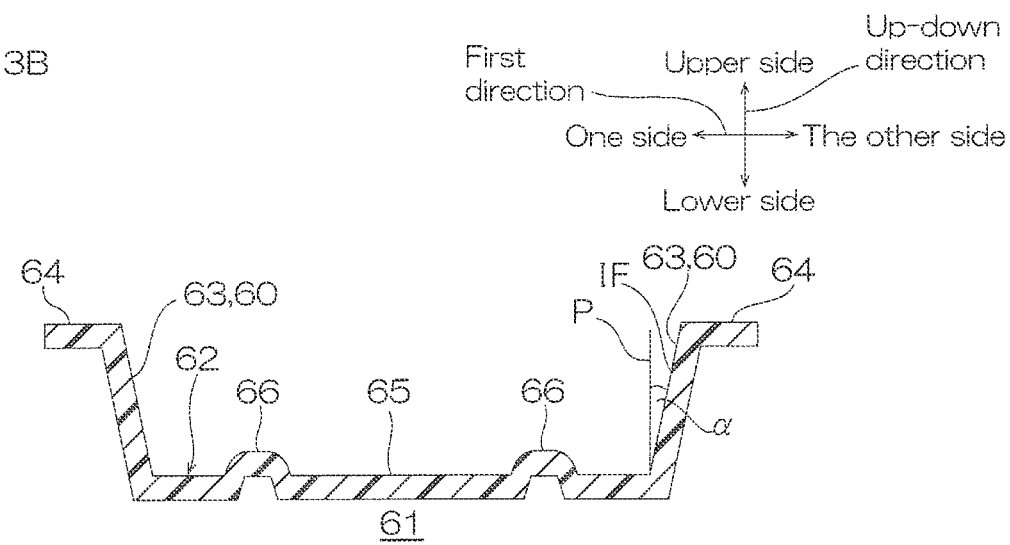

[Casing] A casing 61 illustrated in FIG. 3A and FIG. 3B is a casing for containing a board to contain the wired circuit board 1 in FIG. 1 and FIG. 2B. The casing 61 has a tubular shape with a bottom. Specifically, the casing 61 integrally has a bottom wall 62, and a peripheral side wall 63 extending upward from a peripheral edge of the bottom wall 62.

The bottom wall 62 has an approximately rectangular board shape slightly larger than the wired circuit board 1 in the plan view. The bottom wall 62 integrally has a flat portion 65 as an exemplary interval portion, and a bottom wall protrusion portion 66 as an exemplary contact portion.

The flat portion 65 has a flat upper surface extending in the surface direction.

The top of the bottom wall protrusion portion 66 is located at an upper side relative to the upper surface of the flat portion 65. The bottom wall protrusion portion 66 protrudes from the upper surface of the flat portion 65 toward the upper side. A plurality of bottom wall protrusion portions 66 is provided for one flat portion 65. The bottom wall protrusion portions 66 are disposed at intervals on the bottom wall 62. The bottom wall protrusion portions 66 are disposed at an internal part (a region excluding the peripheral edge portion) relative to the peripheral edge portion of the bottom wall 62. For example, on the bottom wall 62, the four bottom wall protrusion portions 66 are disposed between a central portion and one end in the first direction, between the central portion and the other end in the first direction, between the central portion and one end in the second direction, and between the central portion and the other end in the second direction.

Each of the bottom wall protrusion portions 66 has an approximately circular shape in the plan view.

Each of the four corner portions of the bottom wall 62 has, for example, a curved shape.

The peripheral side wall 63 extends upward from the peripheral edge of the bottom wall 62. The peripheral side wall 63 has an approximately tapered shape having a length that gradually increases while going upward between the peripheral side walls 63 facing each other in the cross-sectional view along the first direction (see FIG. 3B) and in the cross-sectional view along the second direction (not illustrated in FIG. 3B). The peripheral side wall 63 has an approximately semicircular arc shape in the cross-sectional view.

The peripheral side wall 63 has an angle of inclination a that satisfies, for example, the following formula (1), preferably the following formula (2), more preferably the following formula (3).

$$L0 > T1 \times \tan \alpha \tag{1}$$

$$L0 > 1.2 \times T1 \times \tan \alpha \tag{2}$$

$$L0 > 1.5 \times T1 \times \tan \alpha \tag{3}$$

(L0 is an extension length of the extension part 7. T1 is a thickness of the metal supporting layer 2. α is an angle of inclination of the peripheral side wall 63.)

The angle of inclination a of the peripheral side wall 63 is an angle formed by a perpendicular P orthogonal to the upper surface of the flat portion 65 and an inner surface IF of the peripheral side wall 63.

Figure 5B:
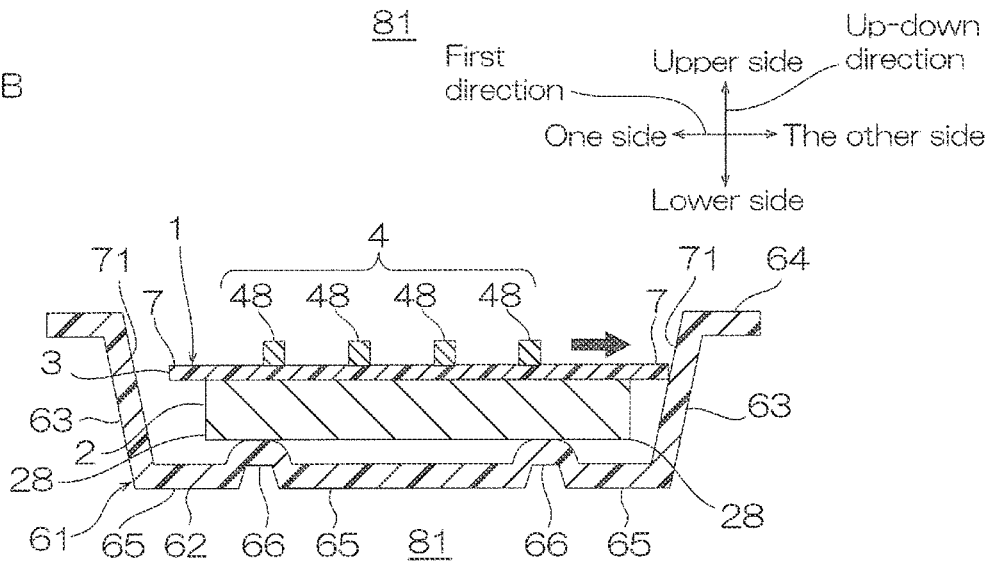

Provided that the angle of inclination a of the peripheral side wall 63, the extension length L0 of the extension part 7, and the thickness T1 of the metal supporting layer 2 satisfy the above-described formula; the contact of the metal protrusion side 28 (peripheral edge) of the metal supporting layer 2 inside the extension part 7 with the peripheral side wall 63 can surely be suppressed when the extension part 7 is brought into contact with the peripheral side wall 63 as illustrated in FIG. 5A and FIG. 5B.

Corresponding to the four sides of the bottom wall 62, the peripheral side wall 63 has four side walls 60. Each of the four side walls 60 has an approximate board shape.

As illustrated in FIG. 4A to FIG. 5B, a first part 71 and a second part 72 are defined on each of the four side walls 60. The first parts 71 can be brought into contact with the extension parts 7 when the wired circuit board 1 is contained. The second parts 72 can be separated from the second extension parts 8 by intervals when the wired circuit board 1 is contained. In other words, each of the four side walls 60 consists of the first part 71 and the second part 72. Specifically, the first part 71 is a part facing the extension part 7 when the casing 61 contains the wired circuit board 1. The second part 72 is a part facing the second extension part 8 when the casing 61 contains the wired circuit board 1.

As illustrated in FIG. 3A and FIG. 3B, the casing 61 further includes a brim 64. The brim 64 extends outward from an upper edge of the peripheral side wall 63. The brim 64 is a handle of the casing 61.

The material of the casing 61 is not especially limited, and examples thereof include resins, metals, and ceramics. To secure excellent moldability and achieve the reduction in weight, preferably, resin is used.

However, when the metal protrusion side 28 (peripheral edge) of the metal supporting layer 2 is brought into contact (collides) with the peripheral side wall 63 of the casing 61, a resin material is more likely to create a foreign matter than a metal or ceramic material.

However, in the first embodiment, as described below, the extension part 7 extending further outward relative to the metal protrusion side 28 suppresses the above-described contact (collision). Thus, creation of the above-described foreign matter is suppressed. Hence, a resin is suitably used as the material of the casing 61 to secure excellent moldability and achieve the reduction in weight.

[Board Containing Set]

As illustrated in FIG. 4A to FIG. 5B, a board containing set 81 includes the above-described wired circuit board 1 and casing 61 containing the wired circuit board 1. The board containing set 81 is a board containing kit (or a board containing system) including the above-described wired circuit board 1 and casing 61.

The wired circuit board 1 is disposed on the bottom wall 62 of the casing 61. Specifically, the lower surface of the metal supporting layer 2 is in contact with the upper surface of the bottom wall protrusion portion 66.

On the other hand, the lower surface of the metal supporting layer 2 is separated from the upper surface of the flat portion 65 by an interval in the up-down direction. Further, (an lower end of) the metal protrusion side 28 of the metal supporting layer 2 is not in contact with the bottom wall protrusion portion 66, and is separated from the flat portion 65 by an interval in the up-down direction.

The wired circuit board 1 is disposed to be surrounded by the peripheral side wall 63 of the casing 61. On the peripheral edge of the metal supporting layer 1, the extension parts 7 are the closest to the peripheral side wall 63, and the peripheral side wall 63 adjacent to (facing) the extension parts 7 are the first parts 71.

On the other hand, parts of the peripheral side wall 63 other than the first parts 71 are the second parts 72 in the plan view. A distance (facing length) between the second part 72 and the second extension part 8 is longer than a distance (facing length) between the first part 71 and the extension part 7.

To produce the board containing set 81, first, the above-described wired circuit board 1 and casing 61 are prepared. Next, the wired circuit board 1 is disposed on the bottom wall 62 of the casing 61. At that time, an extension part 7 is allowed to be brought into contact with the peripheral side wall 63 (the first part 71).

The wired circuit board 1 includes the metal supporting layer 2 having a thickness T1 of 50 μm or more. Thus, the metal supporting layer 2 can be thickened. Hence, the wired circuit board 1 can be used for the purpose that requires the rigidity of the metal supporting layer 2.

Meanwhile, the contact of the metal protrusion side 28 (peripheral edge) of the metal supporting layer 2 located inside relative to the extension parts 7 with the peripheral side wall 63 can be suppressed even when the wired circuit board 1 contained in the casing 61 is transported, the vibrations by the transportation is transmitted to the wired circuit board 1, and the extension part 7 is brought into contact with the peripheral side wall 63 of the casing 61.

For example, as illustrated by the arrows in FIG. 5A and FIG. 5B, it is assumed that the wired circuit board 1 moves to the other side in the first direction and the one side in the second direction relative to the casing 61 in the board containing set 81. In such a case, the extension parts 7 corresponding to the board first side portion 11 and the board third side portion 13 are brought into contact with the first parts 71 of the peripheral side wall 63. At that time, the metal protrusion side 28 located inside relative to the above-described extension parts 7 is separated from the first parts 71 by intervals. Thus, the creation of a foreign matter caused by the contact of the metal protrusion side 28 with the peripheral side wall 63 can effectively be suppressed.

On the other hand, at the second extension parts 8, the peripheral edge of the metal supporting layer 2 (the metal sides 27 and the metal corner portions 30) further extends relative to the insulating base layer 3. Thus, when the wired circuit board 1 is contained in the casing 61, the peripheral edge of the metal supporting layer 2 at the second extension parts 8 is closer to the peripheral side wall 63 than the insulating base layer 3 is. As a result, a foreign matter is easily created.

However, the casing 61 has the second parts 72 separated from the second extension parts 8 by intervals. Thus, the damage to the casing 61 can be suppressed, and the creation of a foreign matter can be suppressed.

Accordingly, the wired circuit board 1 has excellent reliability while being used for the purpose that requires the rigidity of the metal supporting layer 2.

Furthermore, the board containing set 81 can contain the wired circuit board 1 used for the purpose that requires the rigidity of the metal supporting layer 2 by using the casing 61 while maintaining the excellent reliability.

In the wired circuit board 1, the ratio (T1/T2) of the thickness T1 of the metal supporting layer to the thickness T2 of the insulating base layer 3 is 5 or more, namely, large. Thus, the metal supporting layer 2 can be much more rigid than the insulating base layer 3.

Meanwhile, the ratio (T1/T2) of the thickness T1 of the metal supporting layer 2 to the thickness T2 of the insulating base layer 2 is 40 or less. Thus, the insulating base layer 3 can have a certain thickness T2 with respect to the thick metal supporting layer 2.

The wired circuit board 1 includes the extension parts 7 having an extension length L0 of 5 μm or more. Thus, when an extension part 7 is brought into contact with the peripheral side wall 63, the contact of the peripheral edge of the metal supporting layer 2 with the peripheral side wall 63 can surely be suppressed.

The wired circuit board 1 includes the extension parts 7 having an extension length L0 of 100 μm or less. Thus, when an extension part 7 is brought into contact with the peripheral side wall 63, the breakage of the extension part 7 is suppressed, and the contact of the peripheral edge of the metal supporting layer 2 with the peripheral side wall 63 can surely be suppressed.

The wired circuit board 1 includes the extension parts 7 having a thickness T1 of 5 μm or more. Thus, when an extension part 7 is brought into contact with the peripheral side wall 63, the contact of the peripheral edge of the metal supporting layer 2 with the peripheral side wall 63 can surely be suppressed.

The wired circuit board 1 includes the extension parts 7 having a thickness T1 of 50 μm or less. Thus, the wired circuit board 1 can be thinned.

As illustrated in FIG. 5A, even when the wired circuit board 1 moves in the first direction in which the board first side portion 11 and the board second side portion 12 face each other, the extension parts 7 included in the board first side portion 11 and the board second side portion 12 can suppress the contact of the peripheral edge of the metal supporting layer 2 located inside relative to the extension parts 7 with the peripheral side wall 63.

The casing 61 includes the bottom wall 62 having the plurality of bottom wall protrusion portions 66 with the same height, and being in contact with the internal part of the peripheral edge of the metal supporting layer 2. Thus, a horizontal position of the wired circuit board 1 can be maintained.

On the other hand, the flat portion 65 is separated from the peripheral edge of the metal supporting layer 2 by an interval in the up-down direction. Thus, even when the metal sides 27 (peripheral edge) of the metal supporting layer 2 move relative to the bottom wall 62 in the surface direction, the damage to (scratch on) the bottom wall 62 by the contact of the metal sides 27 can be suppressed.

Variations of First Embodiment

In the following variations, the same members and steps as in the above-described first embodiment will be given the same numerical references and the detailed description will be omitted. Further, the variations can have the same operations and effects as those of the first embodiment unless especially described otherwise. Furthermore, the first embodiment and its variations can appropriately be combined.

As illustrated in FIG. 6, the bottom wall 62 may not have a bottom wall protrusion portion 66 and can have only a flat portion 65. In the variation, the whole of the lower surface of a metal supporting layer 2 is in contact with the upper surface of the flat portion 65.

The first embodiment of FIG. 1 to FIG. 5B is preferred to the variation of FIG. 6. In the variation of FIG. 6, the peripheral edge of the metal supporting layer 2 (the metal sides 27 and the metal corner portions 30) is in contact with the flat portion 65. This contact leads to creation of a foreign matter. Further, the contact area of the metal supporting layer 2 and the bottom wall 62 in the variation is larger than that of the first embodiment. This easily leads to the creation of a foreign matter by the contact.

On the other hand, in the first embodiment, the peripheral edge of the metal supporting layer 2 (the metal sides 27 and the metal corner portions 30) is separated from the flat portion 65 by intervals in the up-down direction. Thus, the above-described contact can be suppressed. A part of the lower surface of the metal supporting layer 2 is in contact with the bottom wall protrusion portion 66. Thus, the contact area of the lower surface of the metal supporting layer 2 and the bottom wall protrusion portions 66 is smaller than that of the variation of FIG. 6 where the whole of the lower surface of the metal supporting layer 2 is in contact with the flat portion 65. Accordingly, the above-described creation of a foreign matter can effectively be reduced.

As illustrated in FIG. 7, the peripheral side wall 63 may be perpendicular to the flat portion 65.

Figure 8:
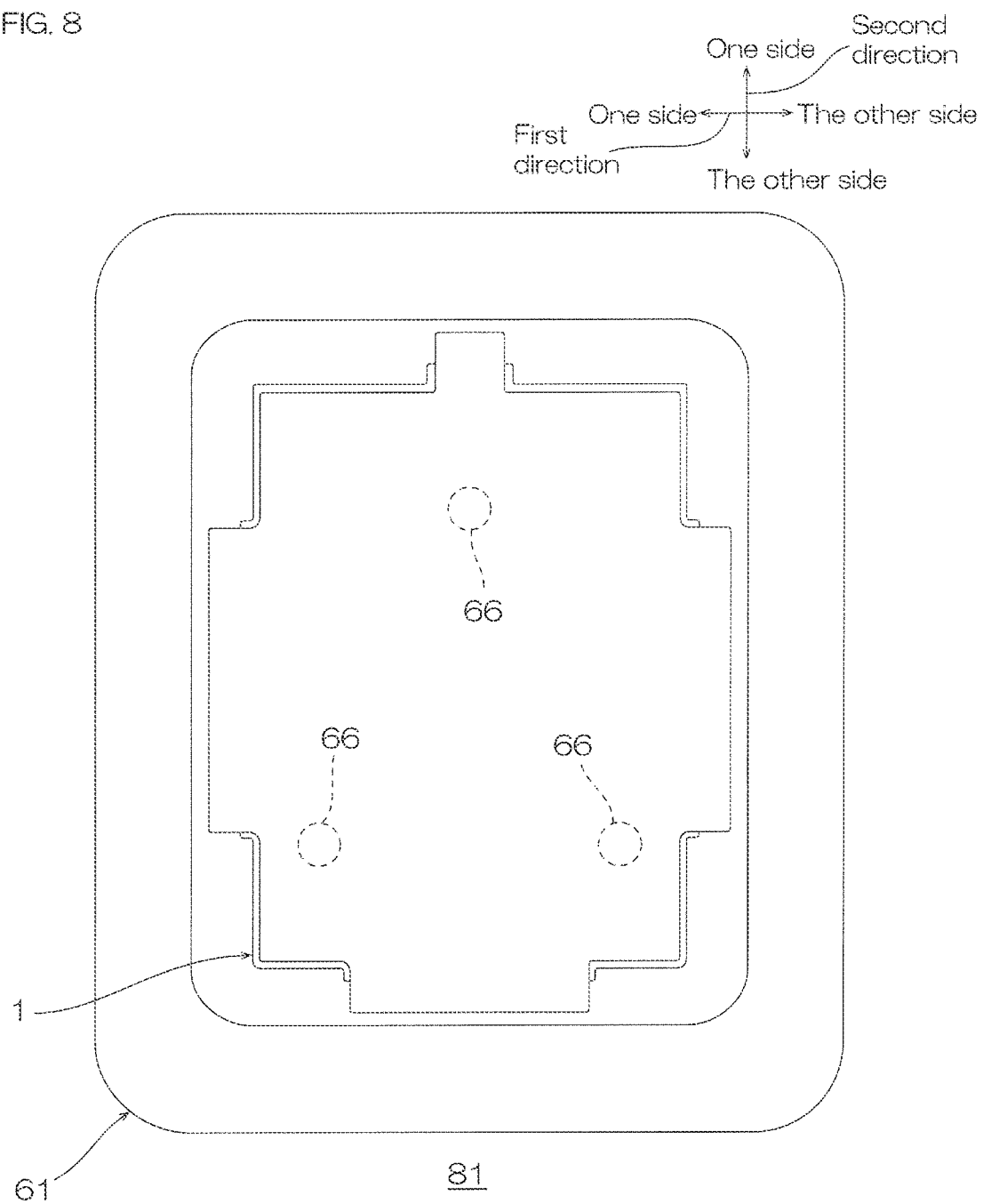
FIG. 8 is a plan view of a variation of the board containing set illustrated in FIG. 4A (an example where the number of the bottom wall protrusion portions is three).

The number of the bottom wall protrusion portions 66 is not especially limited. For example, the number of the bottom wall protrusion portions 66 may be three as illustrated in FIG. 8, or four as illustrated in FIG. 9.

Figure 9:
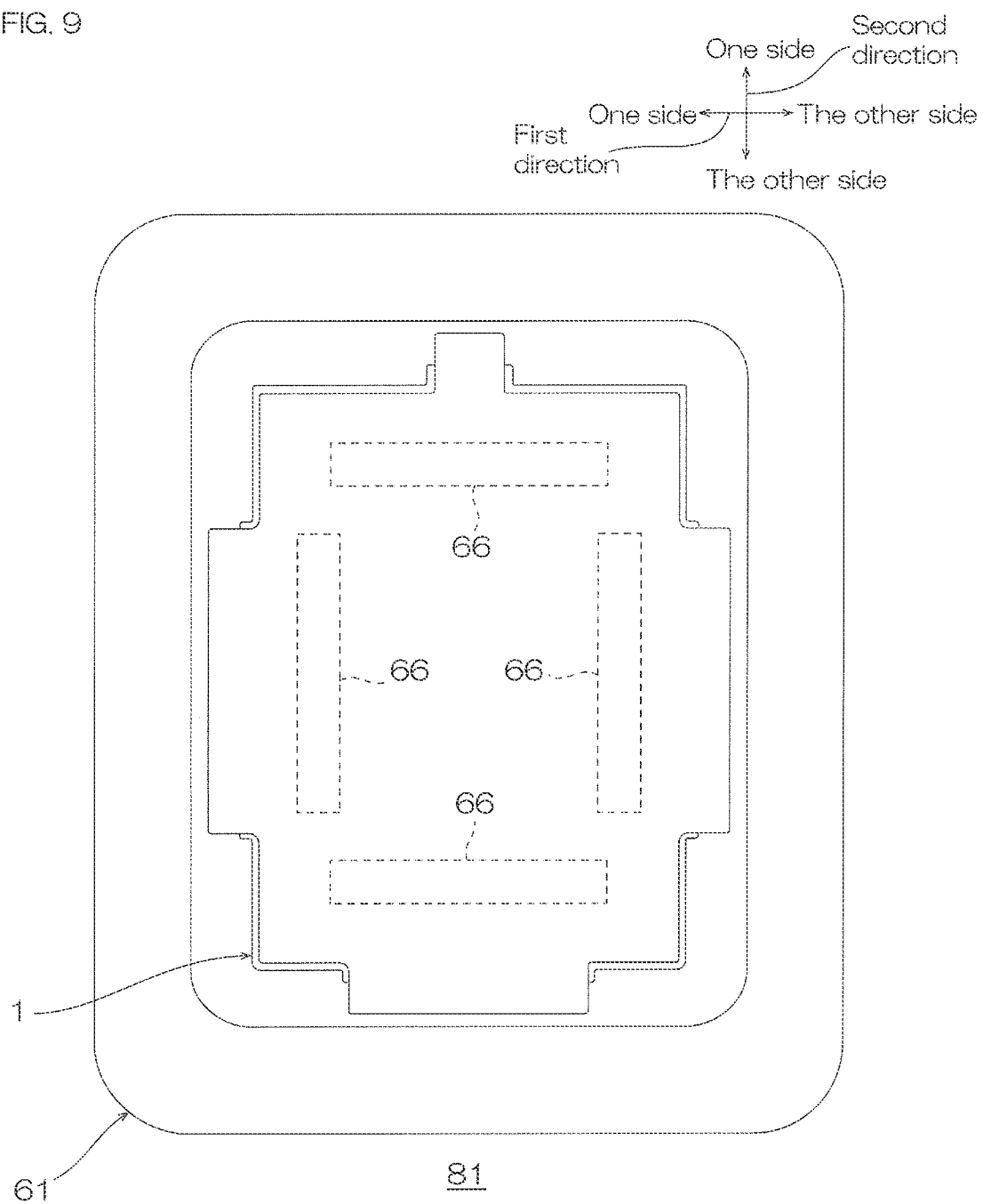
FIG. 9 is a plan view of a variation of the board containing set illustrated in FIG. 4A (an example where the number of the bottom wall protrusion portions is four and the bottom wall protrusion portions each have a straight line shape in the plan view).

The shape of the bottom wall protrusion portion 66 is not especially limited, and may be an approximately straight shape in the plan view as illustrated in FIG. 9. The bottom wall protrusion portion 66 has a shape having a rectangular shape with four chipped vertexes in the plan view.

As illustrated in FIG. 10, the bottom wall protrusion portion 66 may have an approximately rectangular shape in the plan view.

Figure 13A:
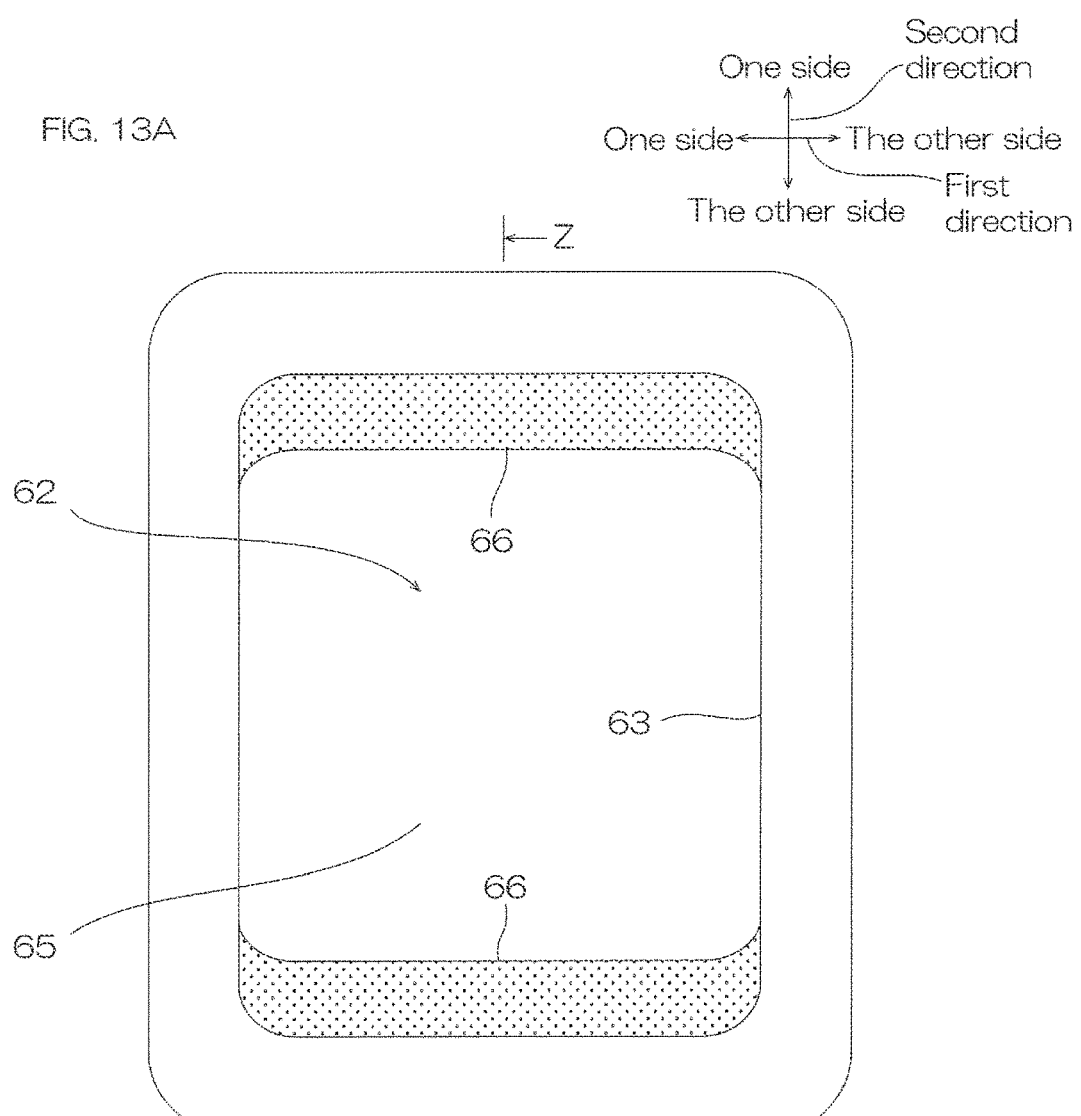
FIG. 13A and FIG. 13B illustrate a variation of the casing illustrated in FIG. 3A and FIG. 3B (an example where the bottom wall protrusion portions traversing the two sides, respectively, are disposed).
Figure 13B:
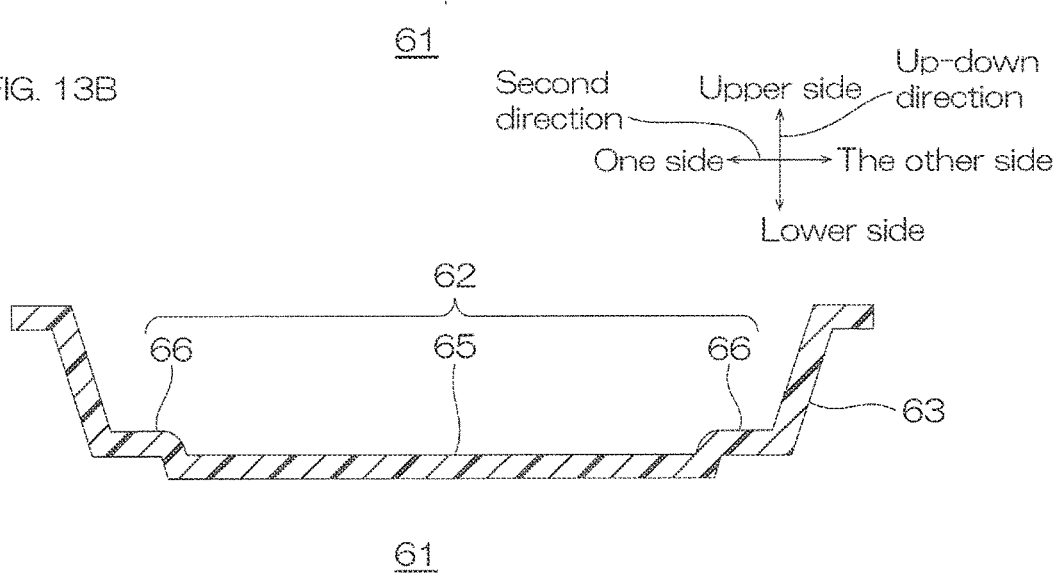

As illustrated in FIG. 11A and FIG. 13A, the bottom wall protrusion portions 66 may be disposed on the peripheral edge portion of the bottom wall 62.

Figure 12A:
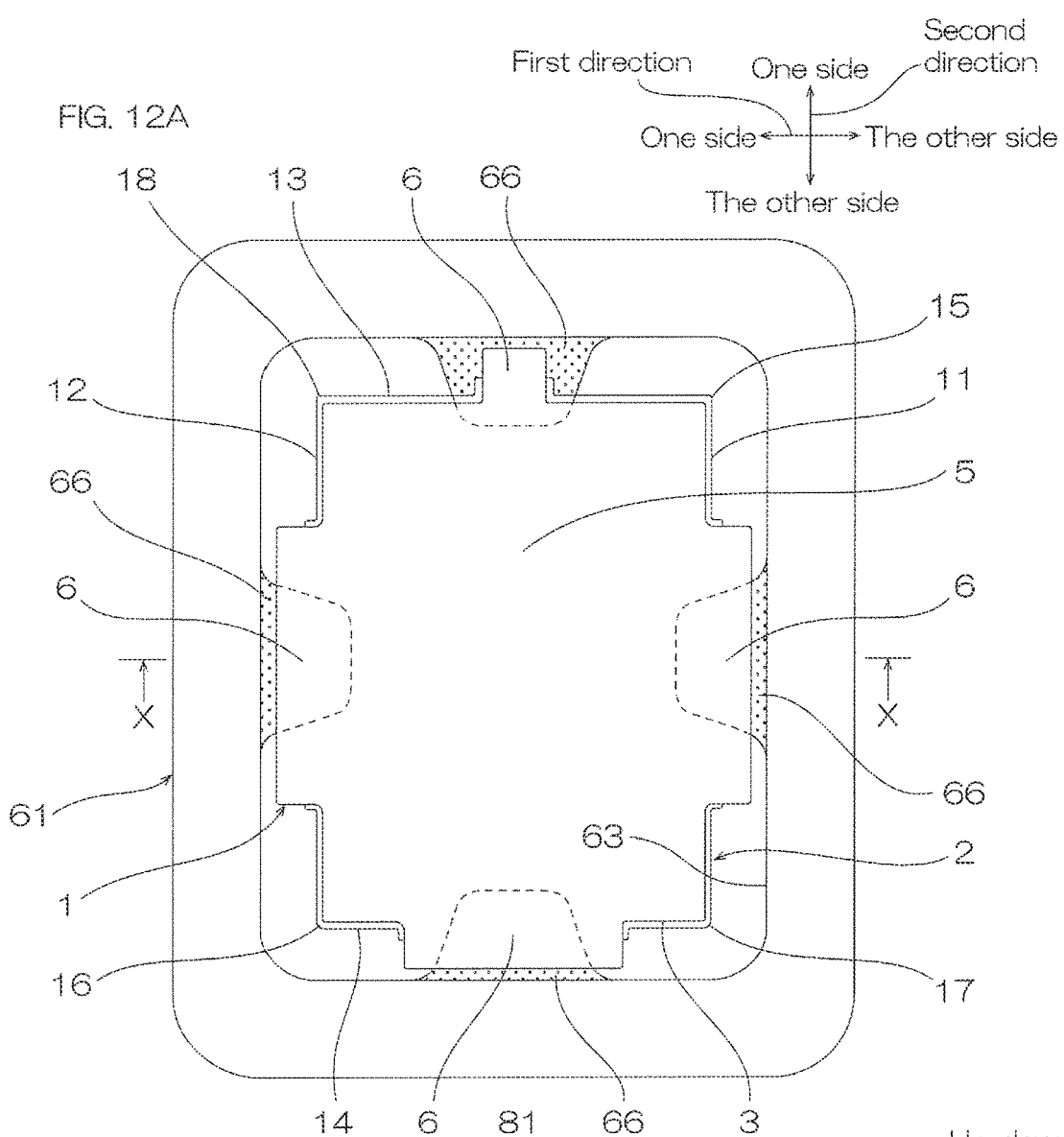
FIG. 12A and FIG. 12B illustrate a board containing set including the casing illustrated in FIG. 11A and FIG. 11B.
Figure 12B:
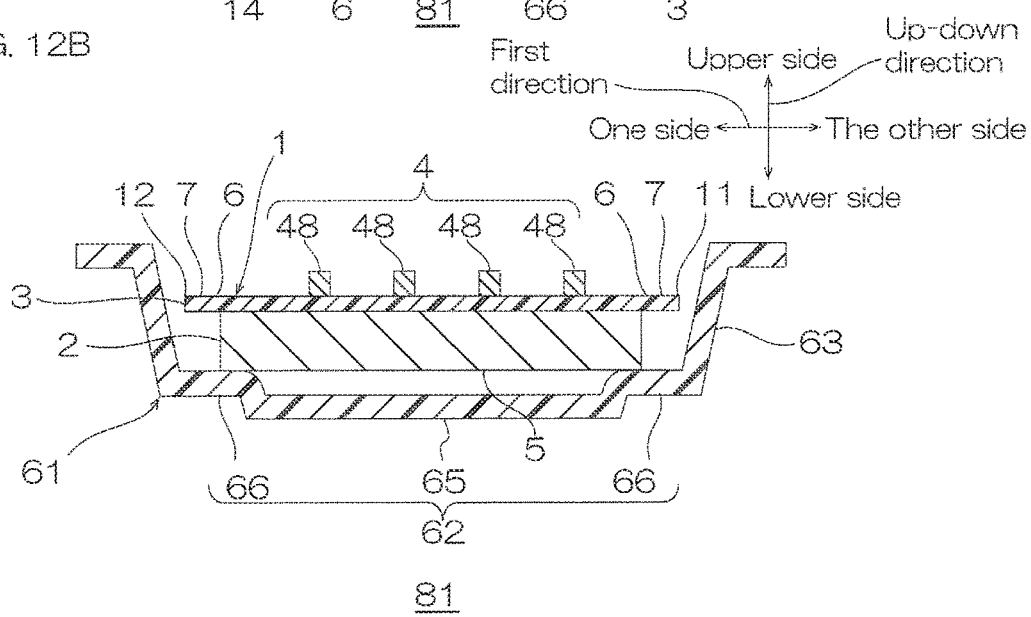

In the variation of FIG. 11A and FIG. 12B, each of the bottom wall protrusion portions 66 each have an approximately rectangular shape including the intermediate portion (preferably, the central portion) of each of the four sides of the bottom wall 62. The bottom wall protrusion portions 66 each have a tapered shape that gradually gets smaller from one side of the bottom wall 62 toward the central portion of the bottom wall 62 in the plan view.

As illustrated in FIG. 12A and FIG. 12B, in the board containing set 81, a lower surface of the metal supporting layer 2 of the board protrusion portion 6 of the wired circuit board 1 and the board body portion 5 in proximity to the board protrusion portion 6 is in contact with the upper surface of the bottom wall protrusion portion 66.

On the other hand, at the central portion of the board body portion 5; the board first corner portion 15; the board second corner portion 16; the board third corner portion 17; the board fourth corner portion 18; and both edges of each of the board first side portion 11, the board second side portion 12, the board third side portion 13, and the board fourth side portion 14, the lower surface of the metal supporting layer 2 is separated from the flat portion 65 by intervals in the up-down direction.

In the same manner as the first embodiment, the contact area of the metal supporting layer 2 and the bottom wall 62 of the variation illustrated in FIG. 11A to FIG. 12B can be smaller than the variation of FIG. 6. Thus, the creation of a foreign matter caused by the contact can effectively be reduced.

In the variation illustrated in FIG. 13A to FIG. 14B, each of the bottom wall protrusion portions 66 has an approximately rectangular shape entirely including each of two sides facing each other on the bottom wall 62. Each of the bottom wall protrusion portions 66 traverses the whole of one side of the bottom wall 62, and has an approximately straight shape along the one side in the plan view.

Figure 14A:
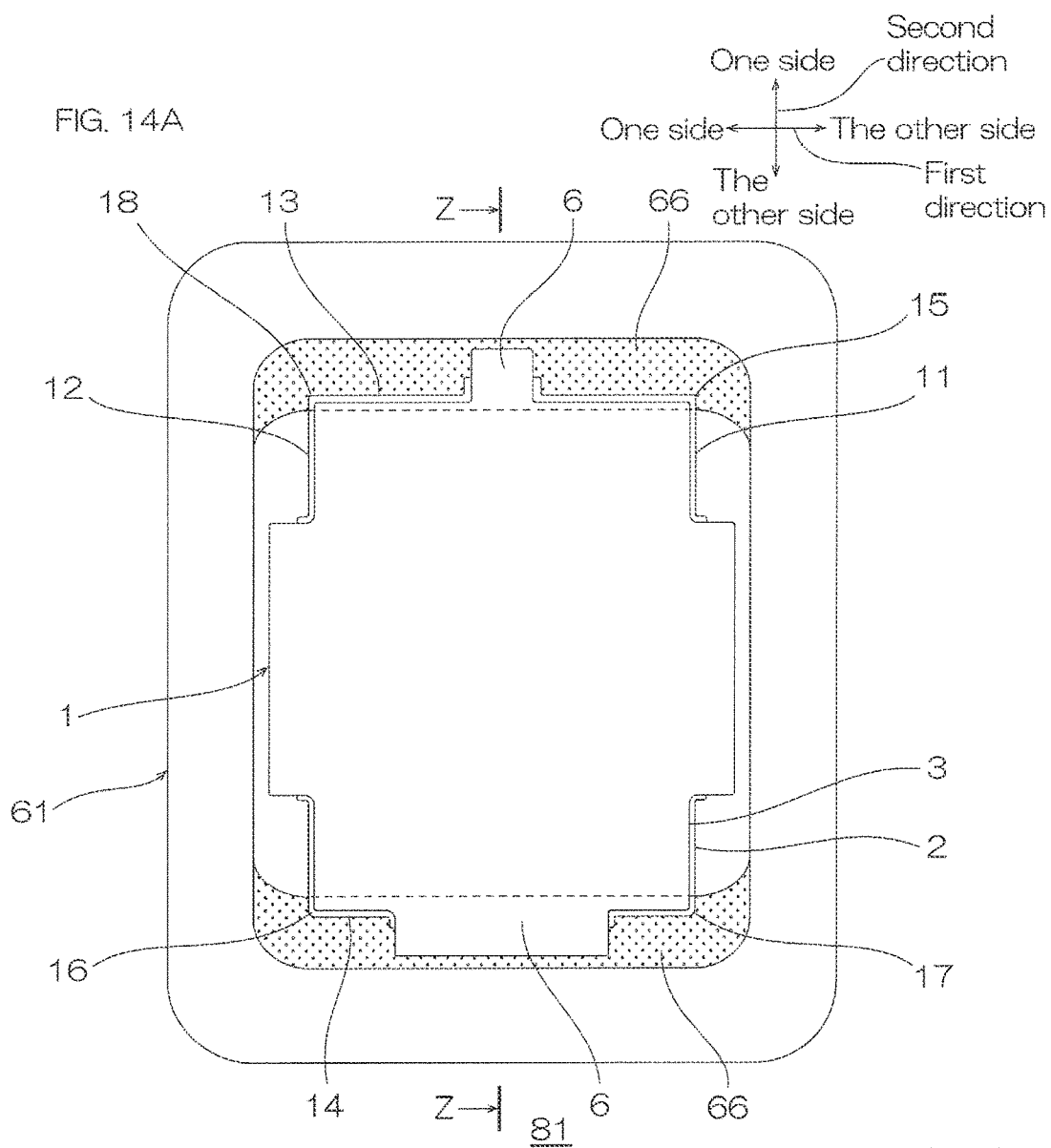
FIG. 14A and FIG. 14B illustrate a board containing set including the casing illustrated in FIG. 13A and FIG. 13B.
Figure 14B:
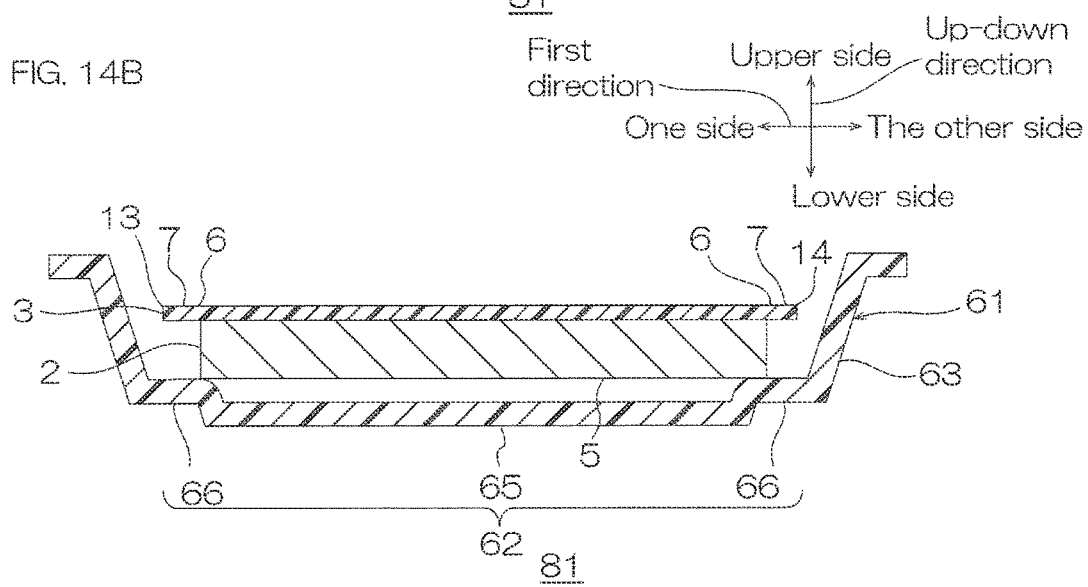

As illustrated in FIG. 14A and FIG. 14B, in the board containing set 81, the board third side portion 13, board protrusion portion 6 corresponding to the board third side portion 13, board fourth side portion 14, and board protrusion portion 6 corresponding to the board fourth side portion 14 of the wired circuit board 1 are in contact with the bottom wall protrusion portion 66. Further, the board first corner portion 15, board second corner portion 16, board third corner portion 17, and board fourth corner portion 18 are in contact with the bottom wall protrusion portion 66 as well.

On the other hand, the central portion, board first side portion 11 (except for the board first corner portion 15 and the board third corner portion 17), board protrusion portion 6 corresponding to the board first side portion 11, board second side portion 12 (except for the board second corner portion 16 and the board fourth corner portion 18) and board protrusion portion 6 corresponding to the board second side portion 12 of the wired circuit board 1 are separated from the flat portion 65 by intervals in the up-down direction.

In the same manner as the first embodiment, the contact area of the metal supporting layer 2 and the bottom wall 62 of the variation illustrated in FIG. 13A to FIG. 14B can also be smaller than the variation of FIG. 6. Thus, the creation of a foreign matter caused by the contact can effectively be reduced.

Figure 15:
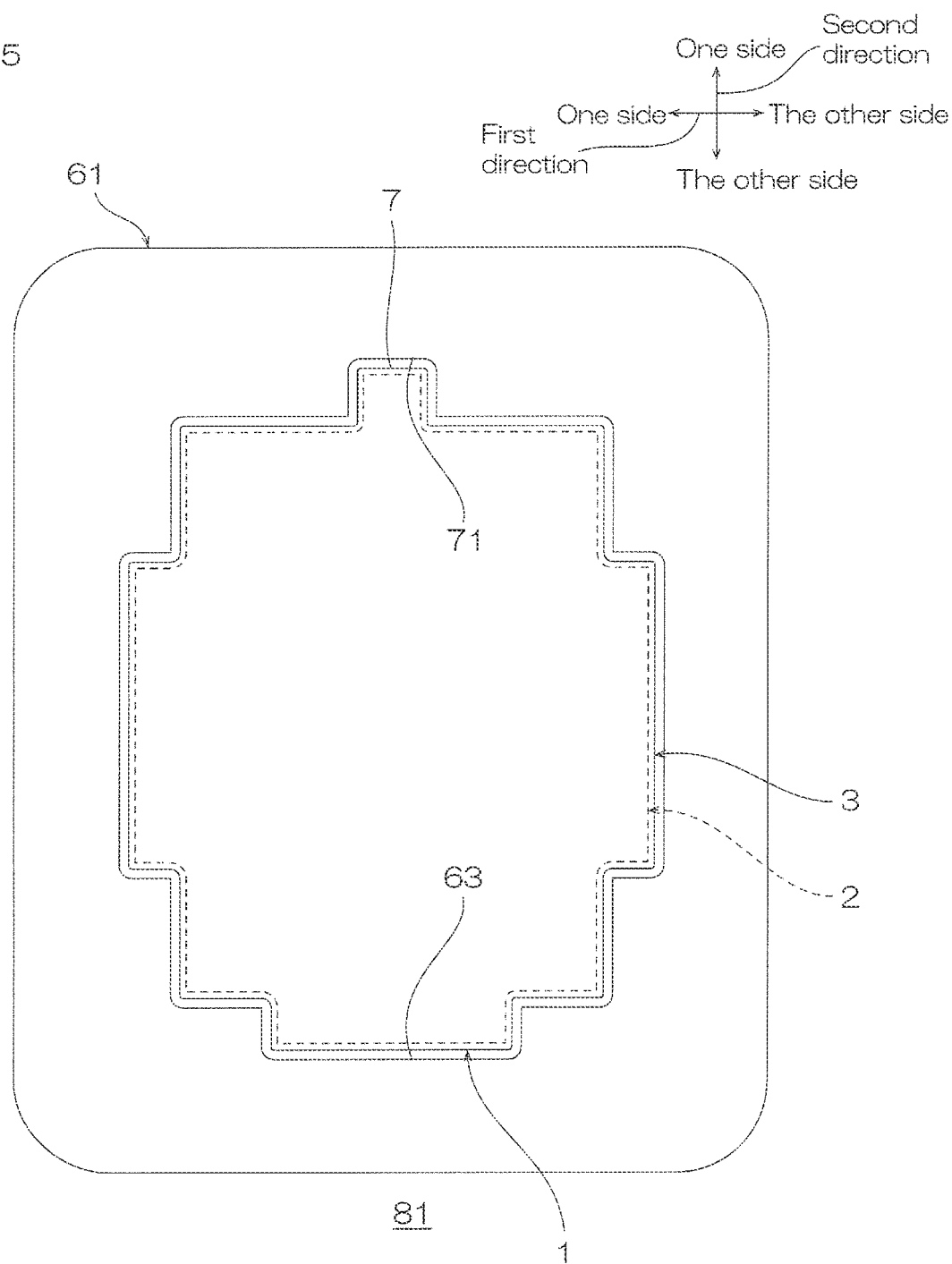
FIG. 15 is a plan view of a variation of the board containing set illustrated in FIG. 4A (an example where the board containing set including a wired circuit board that does not include a second extension part and a casing that does not include a second part).

As illustrated in FIG. 15, the wired circuit board 1 may not include a second extension part 8, and can include only an extension part 7. In other words, the peripheral edge of the wired circuit board 1 is made of the extension part 7. The extension part 7 corresponds to the whole of each of the four base sides 37 of the insulating base layer 2.

The peripheral side wall 63 has a slightly larger similar shape to the extension part 7 of the wired circuit board 1.

Figure 16:
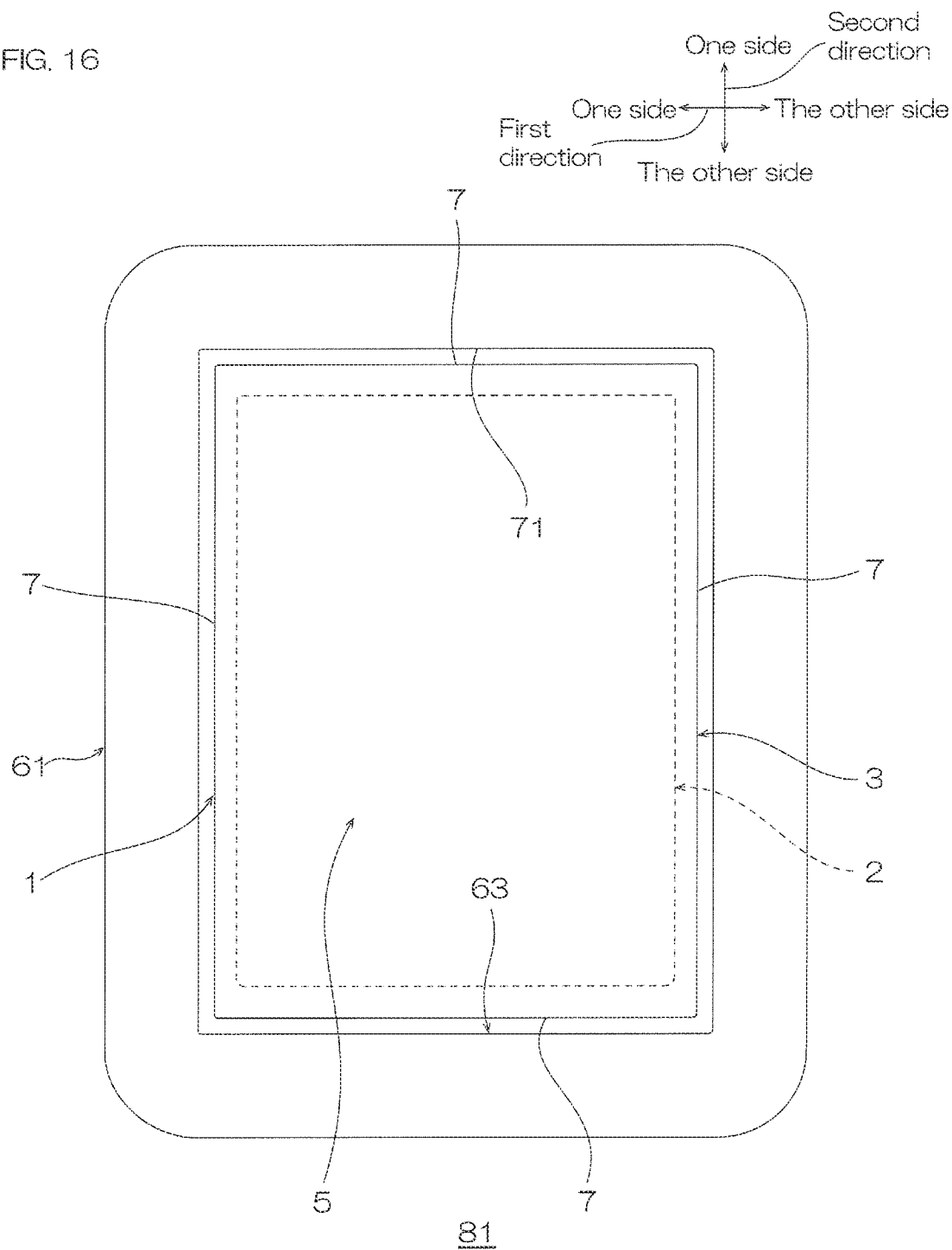
FIG. 16 is a plan view of a variation of the board containing set illustrated in FIG. 15 (an example where the board containing set including a wired circuit board that does not have a board protrusion portion).

As further illustrated in FIG. 16, the wired circuit board 1 may not include a board protrusion portion 6, and can include only a board body portion 5. Each of the four board side portions of the board body portion 5 has an extension part 7.

In the first embodiment, the extension parts 7 are provided at the board first side portion 11 to the board fourth side portion 14. Although not illustrated, however, the extension parts 7 may not be provided at the board third side portion 13 and the board fourth side portion 14 but be provided at the board first side portion 11 and the board second side portion 12.

Further, the extension part 7 may not be provided at the board second side portion 12 but can be provided only at the board first side portion 11. In such a case, when the bottom wall 62 of the casing 61 is inclined downward toward the other side in the first direction, the extension part 7 corresponding to the board first side portion 11 slips downward and is brought into contact (collides) with the side wall 60 (the first part 71). However, the contact of the peripheral edge of the metal supporting layer 2 inside the extension part 7 with the first part 71 can be suppressed.

Although not illustrated, the shape of the wired circuit board 1 is not limited to the above-described shape, and may be, for example, an approximate triangle in the plan view, an approximate circle in the plan view, or an approximate cross in the plan view.

The casing 61 may have a partial opening formed on the bottom wall 62 and/or the peripheral side wall 63.

Second Embodiment

In the following second embodiment, the same members and steps as in the above-described first embodiment and variations will be given the same numerical references and the detailed description will be omitted. Further, the second embodiment can have the same operations and effects as those of the first embodiment and variations unless especially described otherwise. Furthermore, the first embodiment, variations and second embodiment can appropriately be combined.

The wired circuit board 1, casing 61 and board containing set 81 of the second embodiment are described with reference to FIG. 17 to FIG. 20. To clearly show the relative disposition of the metal supporting layer 2, insulating base layer 3, and casing 61; the peripheral side wall 63 is omitted in FIG. 19 and FIG. 20.

Figure 17:
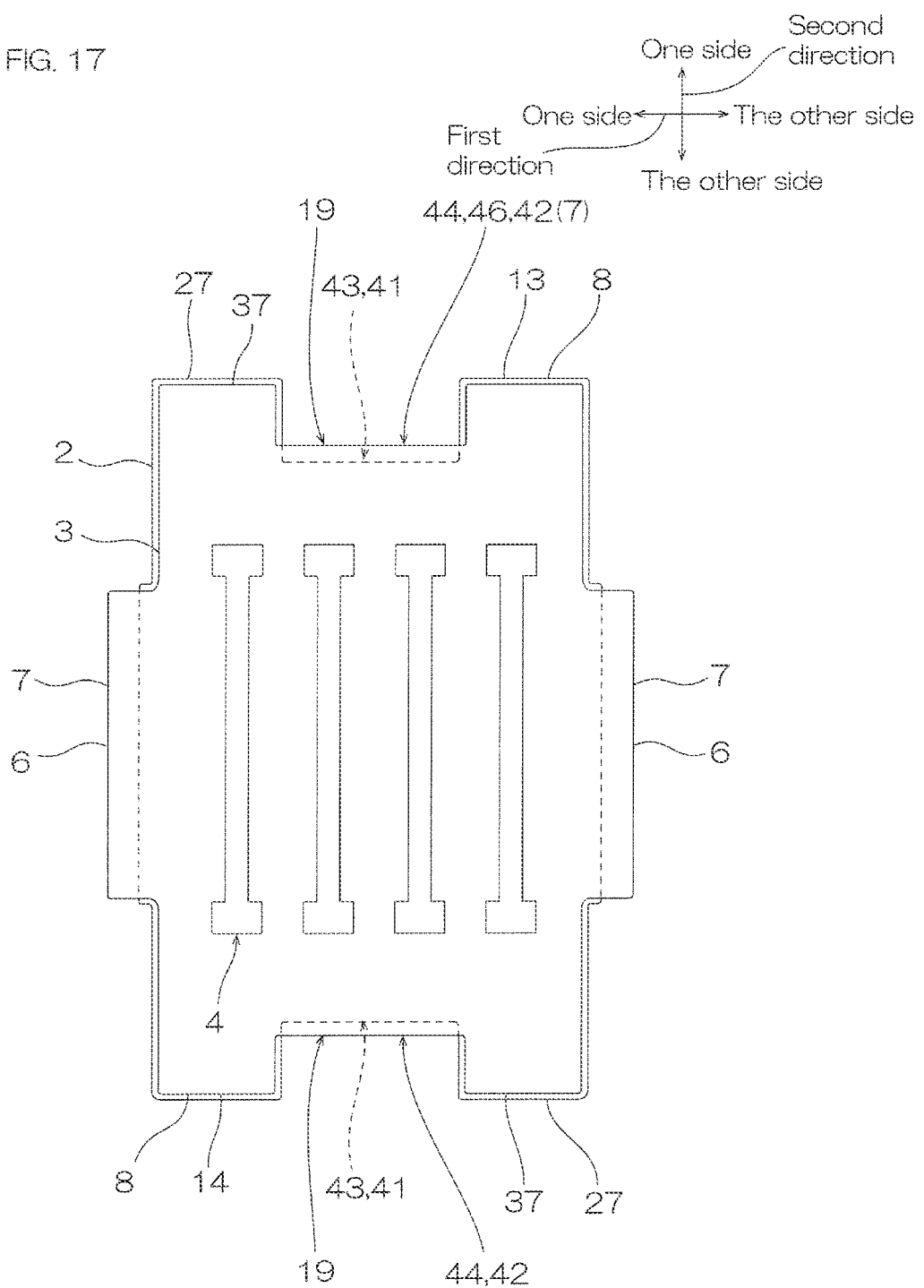
FIG. 17 is a plan view of the second embodiment of the wired circuit board of the present invention (a wired circuit board including a board concave portion).

As illustrated in FIG. 17, in the second embodiment, a wired circuit board 1 includes board concave portions 19 in place of some of board protrusion portions 6.

Figure 19:
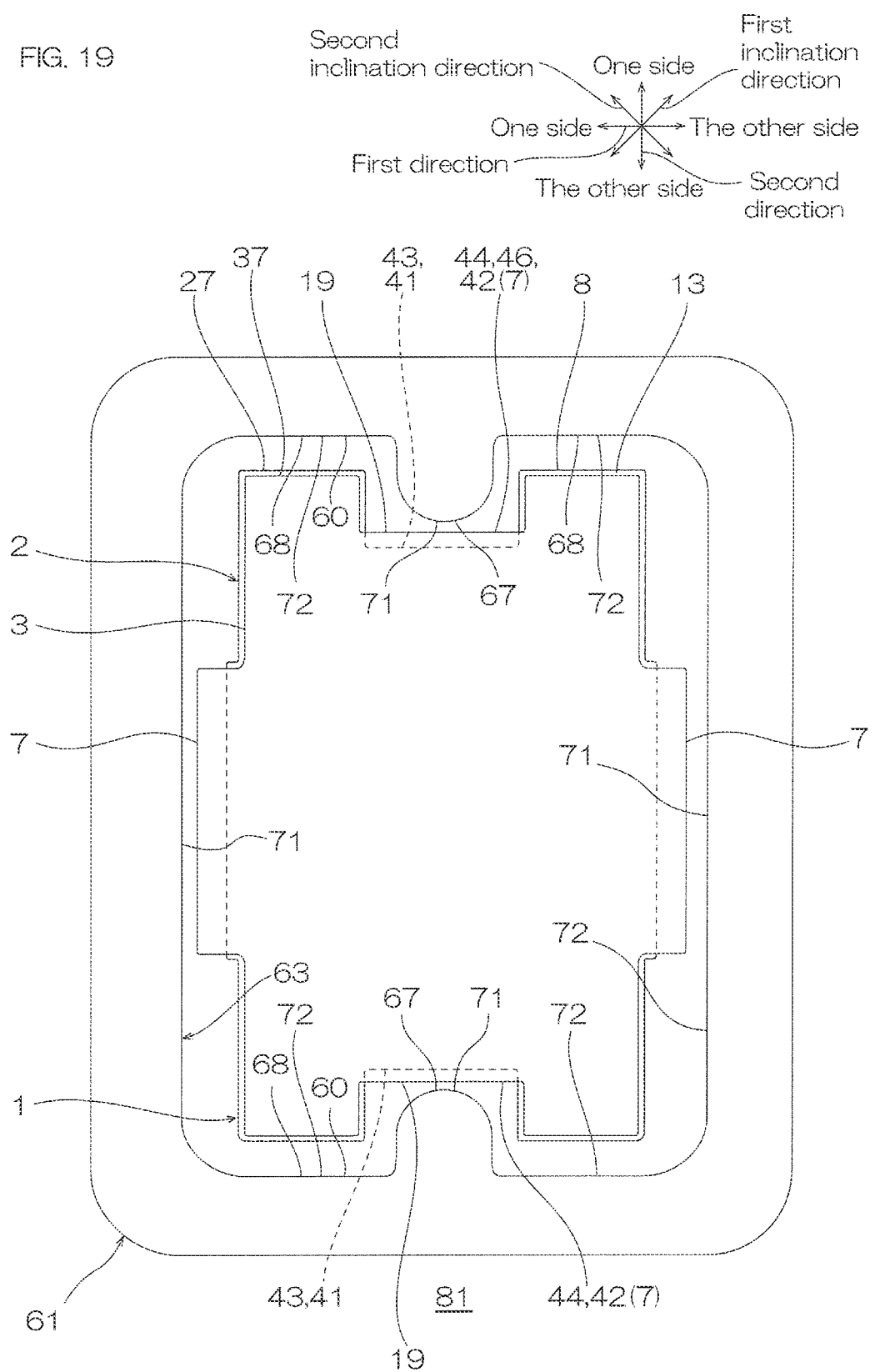
FIG. 19 is a plan view of a board containing set including the wired circuit board illustrated in FIG. 17 and the casing illustrated in FIG. 18.

As illustrated in FIG. 17 and FIG. 19, the wired circuit board 1 includes the board concave portions 19 caving in from a board third side portion 13 and a board fourth side portion 14, respectively.

Each of the board concave portions 19 includes a metal concave portion 41 in the metal supporting layer 2, and a base concave portion 42 in the insulating base layer 3.

The metal concave portion 41 caves in from a metal side 27. The metal concave portion 41 has a metal internal side 43 (dotted line) located inside relative to the metal side 27. The metal internal side 43 is parallel to the metal side 27.

The base concave portion 42 caves in from the base side 37. The base concave portion 42 has a base internal side 44 located inside relative to the base side 37. The base internal side 44 is parallel to the base side 37.

Also in the second embodiment, the base internal side 44 is located outside relative to the metal internal side 43. Thus, the base free end portion 46 including the base internal side 44 becomes the extension part 7. The base internal side 44 is parallel to the metal internal side 43.

Figure 18:
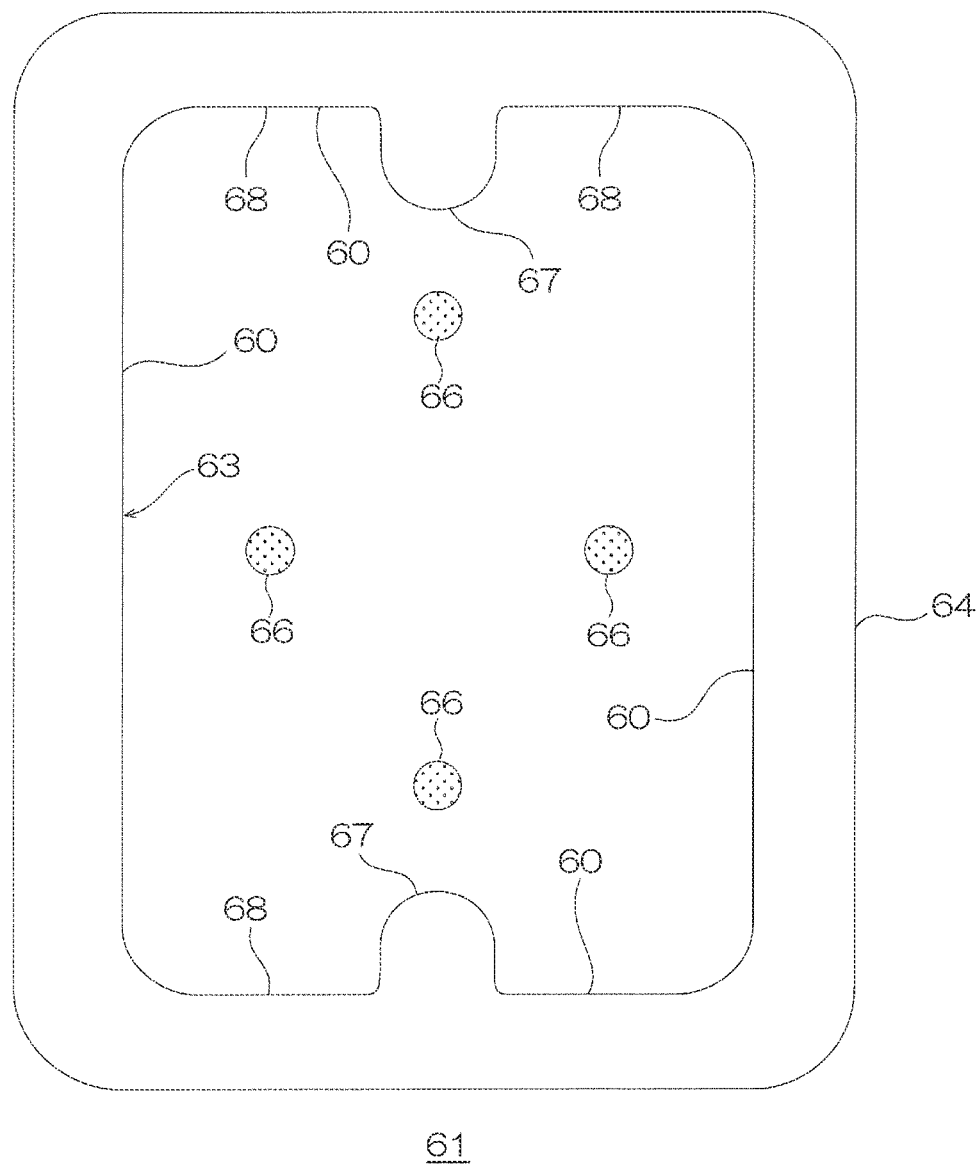
FIG. 18 is a plan view of a casing for containing the wired circuit board illustrated in FIG. 17.

On the other hand, in the casing 61 and the board containing set 81 as illustrated in FIG. 18 and FIG. 19, one side wall 60 has a flat side wall 68, and a side wall protrusion portion 67 protruding inward from the flat side wall 68 in the surface direction.

The side wall protrusion portion 67 extends in the up-down direction. The side wall protrusion portion 67 protrudes inward from an intermediate portion (preferably, a central portion) of the flat side wall 68 so as to have an approximately semicircular arc shape in the plan view. The side wall protrusion portion 67 is a first part 71. The flat side wall 68 is a second part 72.

In the board containing set 81, the extension parts 7 of the board concave portion 19 of the wired circuit board 1 and the side wall protrusion portions 67 (the first parts 71) of the casing 61 closely face each other.

On the other hand, the second extension part 8 adjacent to the board concave portion 19 is separated from the flat side wall 68 (the second part 72) of the casing 61 by an length (interval) larger than the length between the extension part 7 and the side wall protrusion portion 67 (the first part 71).

Figure 20:
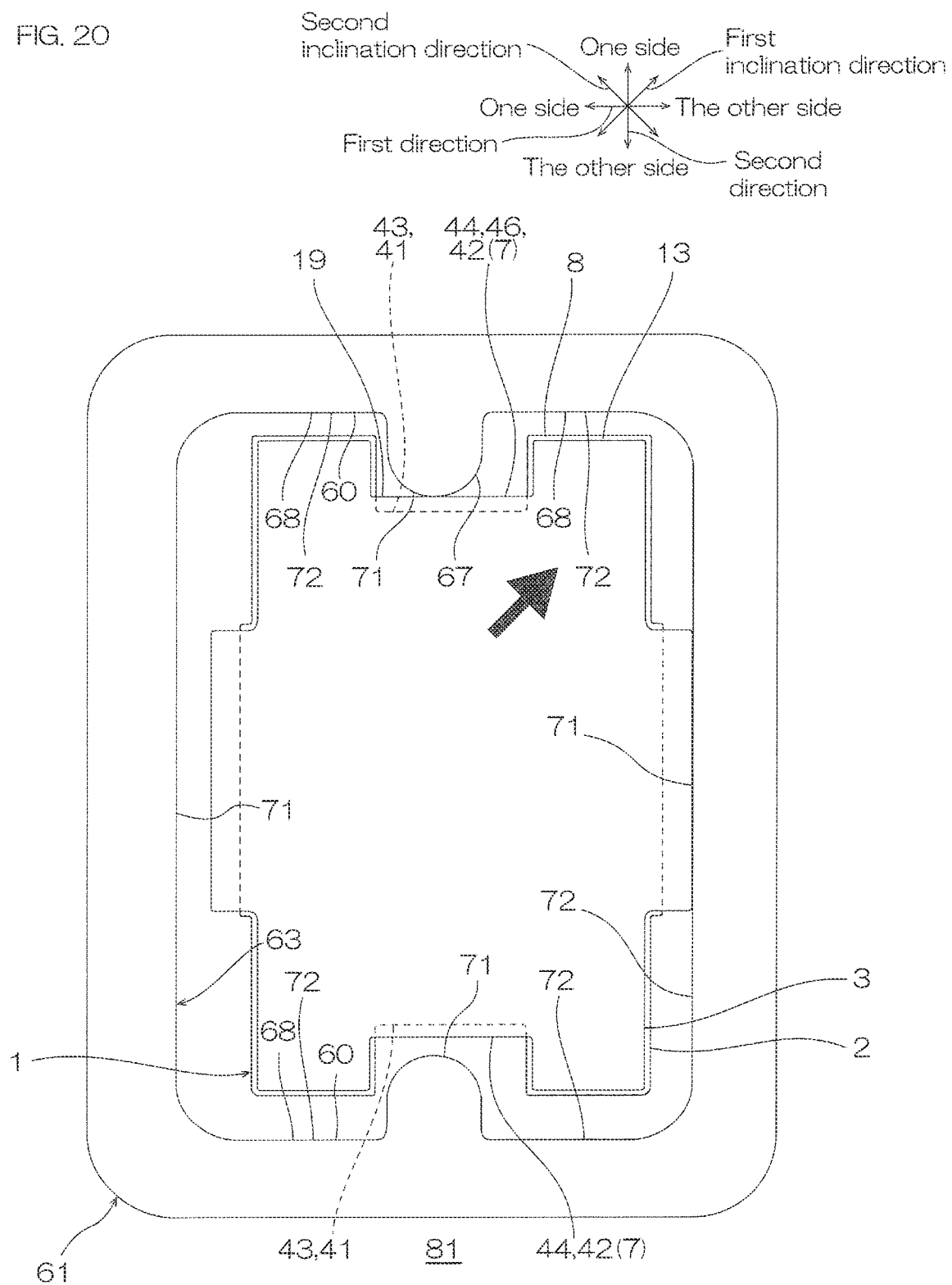
FIG. 20 is a plan view of the board containing set illustrated in FIG. 19 when the wired circuit board moves.

As illustrated by the arrow in FIG. 20, it is assumed that the wired circuit board 1 moves to the other side in the first direction and one side in the second direction relative to the casing 61 in the board containing set 81. In such a case, the extension part 7 of the board concave portion 19 at the one side in the second direction is brought into contact with the side wall protrusion portion 67 (the first part 71). At the same time, the extension part 7 corresponding to the board first side portion 11 is brought into contact with the peripheral side wall 63 (the first part 71) facing the board first side portion 11. At that time, the metal internal side 43 located inside relative to the above-described extension part 7 is separated from the peripheral side wall 63 (the first part 71) by an interval. Thus, the creation of a foreign matter caused by the contact of the metal protrusion side 28 with the peripheral side wall 63 can effectively be suppressed.

On the other hand, the metal sides 27 (peripheral edge) of the metal supporting layer 2 at the second extension parts 8 of the board third side portion 13 are located closer to the peripheral side wall 63 (the second extension parts 8) than the base side 37 of the insulating base layer 3 is. Thus, in this case, the metal sides 27 are easily brought into contact with the peripheral side wall 63.

However, in the board containing set 81, the metal sides 27 of the metal supporting layer 2 at the second extension parts 8 are separated from the second parts 72 of the peripheral side wall 63 by intervals. Thus, the creation of a foreign matter caused by the contact of the metal side 27 of the metal supporting layer 2 with the peripheral side wall 63 can effectively be suppressed.

Third Embodiment

In the following third embodiment, the same members and steps as in the above-described first embodiment, variations, and second embodiment will be given the same numerical references and the detailed description will be omitted. Further, the third embodiment can have the same operations and effects as those of the first embodiment, variations, and second embodiment unless especially described otherwise. Furthermore, the first embodiment, variations, second embodiment, and the third embodiment can appropriately be combined.

Figure 21:
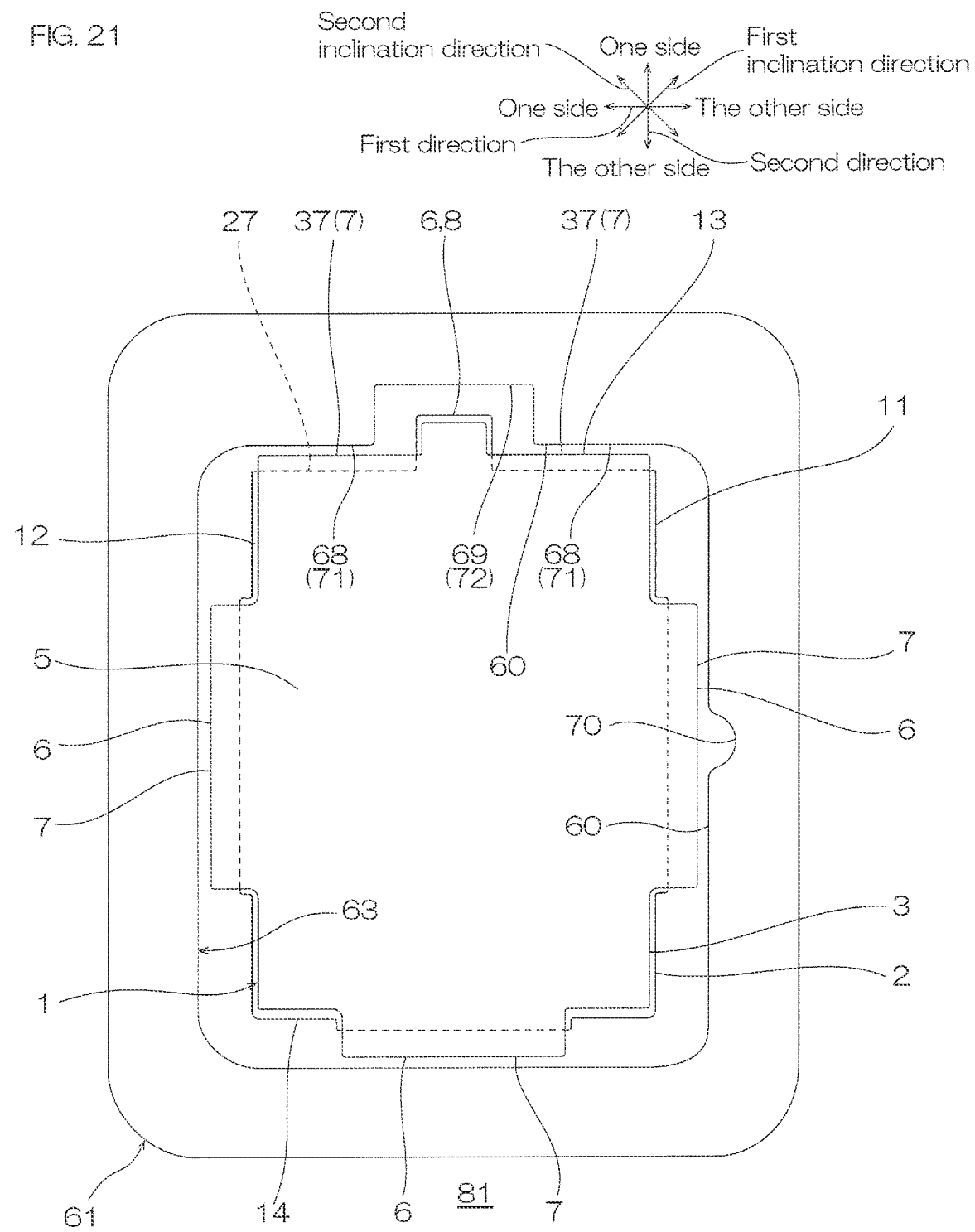
FIG. 21 is a plan view of the third embodiment of the board containing set of the present invention (the wired circuit board including a board body portion having an extension part).
Figure 22:
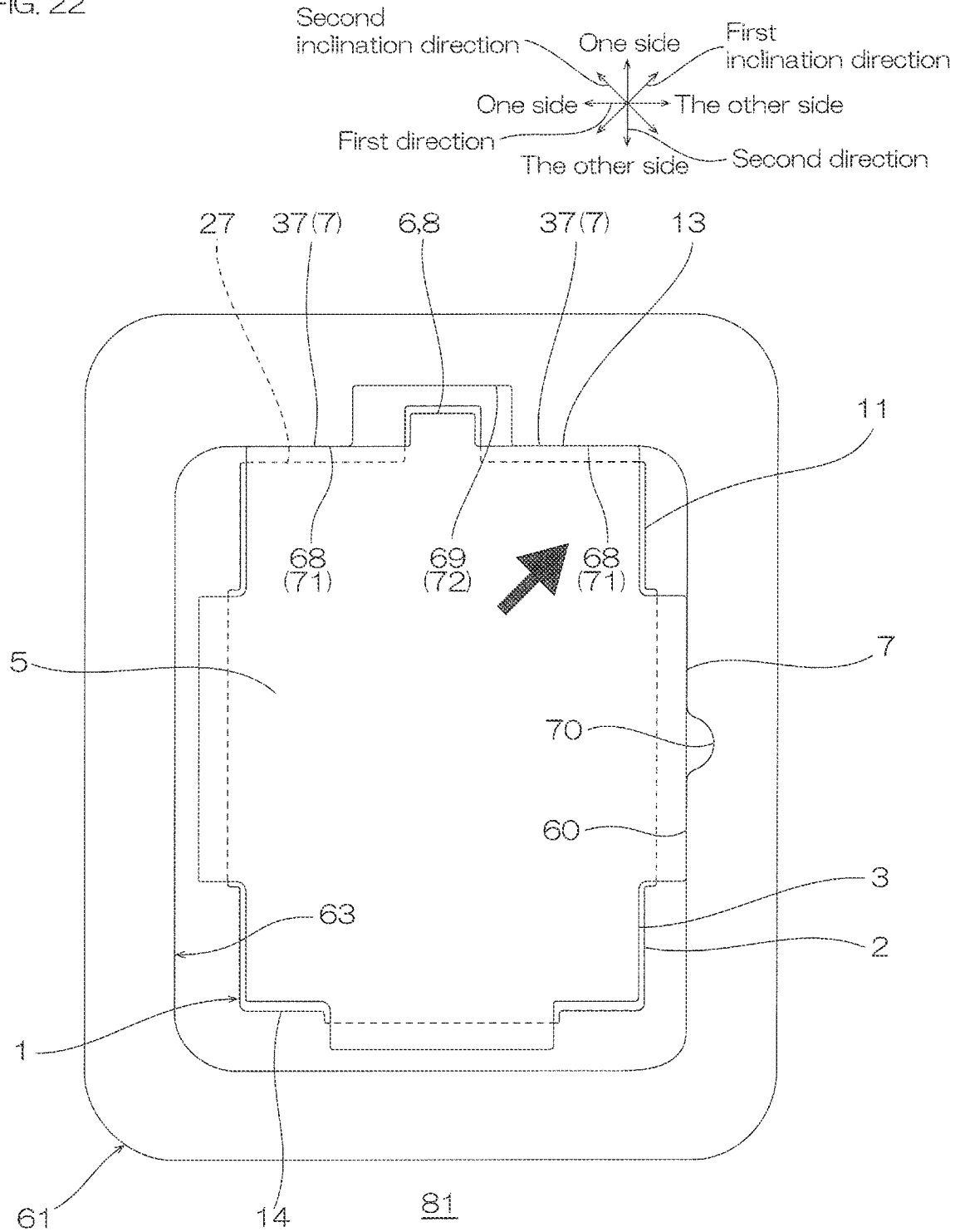
FIG. 22 is a plan view of the board containing set illustrated in FIG. 21 when the wired circuit board moves.

As illustrated in FIG. 21, the board body portion 5 can include an extension part 7. Specifically, a board third side portion 13 of the board body portion 5 includes the extension part 7.

A base side 37 is disposed outside relative to the metal side 27 (at one side in the second direction) at the extension part 7 of the board third side portion 13.

On the other hand, the board protrusion portion 6 protruding from the board third side portion 13 includes a second extension part 8.

In the casing 61, a side wall 60 facing the board third side portion 13 includes a flat side wall 68, and a side wall concave portion 69 caving in outward (toward the one side in the second direction) from a first-direction intermediate portion of the flat side wall 68. In the third embodiment, the flat side wall 68 is a first part 71. The side wall concave portion 69 is a second part 72.

The side wall concave portion 69 is a concave portion larger than the board protrusion portion 6 forming a second extension part 8 in the plan view. Specifically, when the board third side portion 13 (the extension part 7) is brought into contact with the flat side wall 68 (the first part 71), the side wall concave portion 69 (the second part 72) is separated from the second extension part 8 (the board protrusion portion 6) by an interval.

Also in the third embodiment, when the extension part 7 is brought into contact with the first part 71, the second extension part 8 is separated from the second part 72 by an interval.

The side wall 60 facing the board first side portion 11 has another concave portion 70. The concave portion 70 has an approximately semicircular shape in the plan view. The concave portion 70 is an insertion groove. Specifically, an acicular-shaped or hook-shaped pickup member (not illustrated) is inserted in the concave portion 70. The insertion facilitates the ejection of the wired circuit board 1 from the board containing set 81.

Fourth Embodiment

In the following fourth embodiment, the same members and steps as in the above-described first embodiment, variations, second embodiment, and third embodiment will be given the same numerical references and the detailed description will be omitted. Further, the fourth embodiment can have the same operations and effects as those of the first embodiment, variations, second embodiment and third embodiment unless especially described otherwise. Furthermore, the first embodiment, variations, second embodiment, third embodiment, and the fourth embodiment can appropriately be combined.

Figure 23:
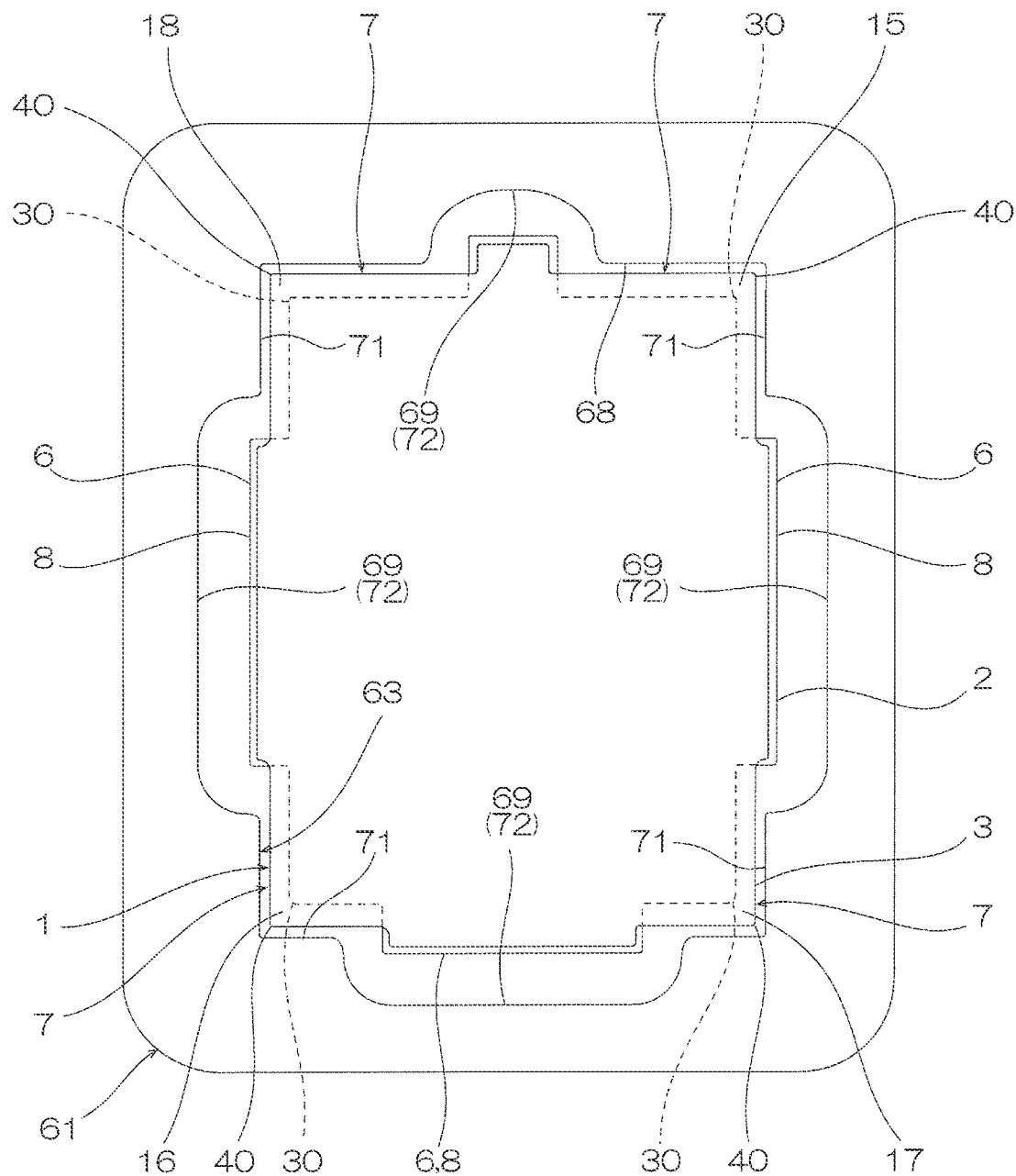
FIG. 23 is a plan view of the fourth embodiment of the board containing set of the present invention (the wired circuit board including a board corner portion having an extension part).

As illustrated in FIG. 23, four extension parts 7 are include in four board corner portions (board first corner portion 15 to board fourth corner portion 18) of a wired circuit board 1, respectively. Four second extension parts 8 are included in four board protrusion portions 6 of the wired circuit board 1, respectively.

The four extension parts 7 are included in four base corner portions 40, respectively. Each of the four extension parts 7 has an approximately L shape in the plan view.

In a casing 61 in a board containing set 81, a side wall 60 has a flat side wall 68 and a side wall concave portion 69. The side wall concave portion 69 is a second part 72. The flat side wall 68 is a first part 71.

Figure 24:
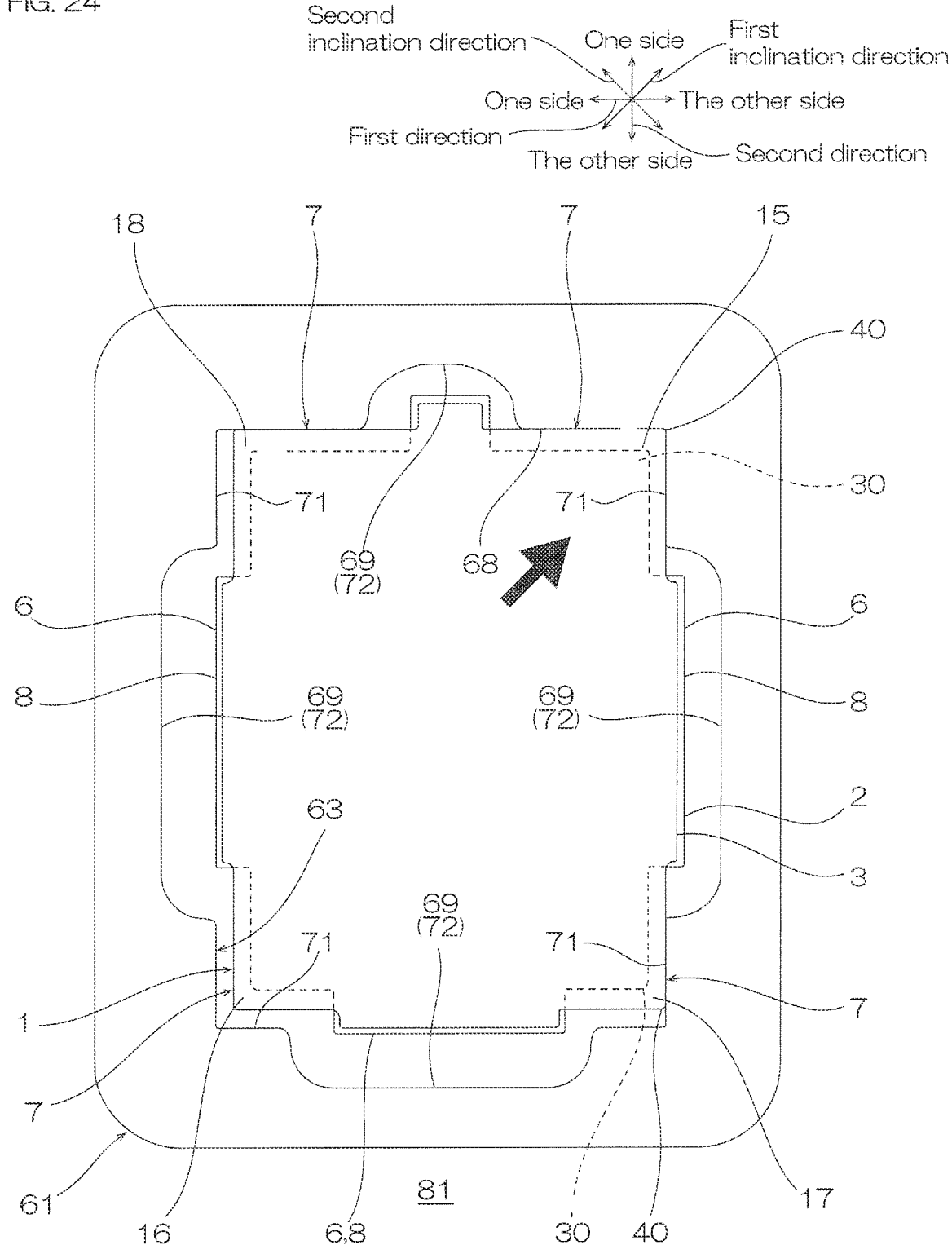
FIG. 24 is a plan view of the board containing set illustrated in FIG. 23 when the wired circuit board moves.

In the fourth embodiment as illustrated by the arrow in FIG. 24, even when the wired circuit board 1 moves in a first inclination direction in which a board first corner portion 15 and a board second corner portion 16 face each other, the extension parts 7 included in the base corner portions 40 of the board first corner portion 15 and board second corner portion 16 can suppress the contact of the metal corner portions 30 located inside relative to the extension parts 7 with the peripheral side wall 63.

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The wired circuit board is included in the board containing set.

DESCRIPTION OF REFERENCE NUMERALS 1 wired circuit board
2 metal supporting layer
3 insulating base layer
4 conductor layer
7 extension part
8 second extension part
11 board first side portion
12 board second side portion
13 board third side portion
14 board fourth side portion
15 board first corner portion
16 board second corner portion
17 board third corner portion
18 board fourth corner portion
27 metal side
28 metal protrusion side
30 metal corner portion
37 base side
38 base protrusion side
40 base corner portion
43 metal internal side
44 base internal side
61 casing
62 bottom wall
63 peripheral side wall
65 flat portion
66 bottom wall protrusion portion
71 first part
72 second part
81 board containing set
L0 extension length of extension part
T1 thickness of extension part
T2 thickness of insulating base layer

The invention claimed is:

1. A wired circuit board comprising:
a metal supporting layer;
an insulating base layer; and
a conductor layer from bottom to top,
wherein a peripheral edge of the insulating base layer includes an extension part extending further outward relative to the metal supporting layer,
wherein the metal supporting layer has a thickness of 50 µm or more, and
wherein the extension part has an extension length of 5 µm or more and 100 µm or less.

2. The wired circuit board according to claim 1, wherein a ratio of the thickness of the metal supporting layer to a thickness of the insulating base layer is 5 or more and 40 or less.

3. The wired circuit board according to claim 1, wherein the extension part has a thickness of 1 µm or more and 50 µm or less.

4. The wired circuit board according to claim 1, further comprising a peripheral edge having a first side and a second side facing the first side, wherein the first side and the second side include the extension part.

5. The wired circuit board according to claim 1, further comprising a peripheral edge having a first corner portion, and a second corner portion facing the first corner portion, wherein the first corner portion and the second corner portion include the extension part.

6. The wired circuit board according to claim 1, wherein a material of the metal supporting layer is copper or a copper alloy.

7. The wired circuit board according to claim 1, wherein a material of the extension part is a polyimide resin.

8. A casing for containing the wired circuit board according to claim 1, the casing comprising:
a bottom wall; and
a peripheral side wall extending upward from a peripheral edge of the bottom wall,
wherein the peripheral side wall has a first part that can be brought into contact with the extension part when the wired circuit board is placed on the bottom wall.

9. A casing for containing a wired circuit board,
wherein the wired circuit board includes:
a metal supporting layer;
an insulating base layer; and
a conductor layer from bottom to top, wherein a peripheral edge of the insulating base layer includes an extension part extending further outward relative to the metal supporting layer, wherein the metal supporting layer has a thickness of 50 μm or more;

wherein the casing includes:
a bottom wall; and
a peripheral side wall extending upward from a peripheral edge of the bottom wall,
wherein the peripheral side wall has a first part that can be brought into contact with the extension part when the wired circuit board is placed on the bottom wall,
wherein a peripheral edge of the metal supporting layer has a second extension part extending further outward relative to the insulating base layer, and
wherein the peripheral side wall has a second part that is separated from the second extension part by an interval when the first part is brought into contact with the extension part.

10. A casing for containing a wired circuit board, wherein the wired circuit board includes:
a metal supporting layer;
an insulating base layer; and
a conductor layer from bottom to top,
wherein a peripheral edge of the insulating base layer includes an extension part extending further outward relative to the metal supporting layer,
wherein the metal supporting layer has a thickness of 50 μm or more;

wherein the casing includes:
a bottom wall; and
a peripheral side wall extending upward from a peripheral edge of the bottom wall,
wherein the peripheral side wall has a first part that can be brought into contact with the extension part when the wired circuit board is placed on the bottom wall,
wherein the bottom wall includes:
a contact portion that can be brought into contact with an internal part disposed inside with respect to a peripheral edge of the metal supporting layer, and
an interval portion that can be separated from the peripheral edge of the metal supporting layer by an interval.

11. A board containing set comprising:
a wired circuit board comprising:
a metal supporting layer;
an insulating base layer; and
a conductor layer from bottom to top,
wherein a peripheral edge of the insulating base layer includes an extension part extending further outward relative to the metal supporting layer,
wherein the metal supporting layer has a thickness of 50 μm or more,
wherein the extension part has an extension length of 5 μm or more and 100 μm or less; and
a casing comprising:
a bottom wall; and
a peripheral side wall extending upward from a peripheral edge of the bottom wall,
wherein the peripheral side wall has a first part that can be brought into contact with the extension part when the wired circuit board is placed on the bottom wall,
wherein the case contains the wired circuit board.

* * * * *